United States Patent
Zheng et al.

(10) Patent No.: US 6,899,963 B1
(45) Date of Patent: May 31, 2005

(54) ELECTROLUMINESCENT DEVICES HAVING PENDANT NAPHTHYLANTHRACENE-BASED POLYMERS

(75) Inventors: Shiying Zheng, Webster, NY (US); Kathleen M. Vaeth, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/786,812

(22) Filed: Feb. 25, 2004

(51) Int. Cl.$^7$ .............................................. H05B 33/14
(52) U.S. Cl. ...................... 428/690; 428/917; 313/504; 313/506; 427/66
(58) Field of Search ................................ 428/690, 917; 313/504, 506; 427/66

(56) References Cited

U.S. PATENT DOCUMENTS

| | | | | |
|---|---|---|---|---|
| 5,281,489 A | * | 1/1994 | Mori et al. | 428/690 |
| 6,329,086 B1 | * | 12/2001 | Shi et al. | 428/690 |
| 6,361,887 B1 | * | 3/2002 | Shi et al. | 428/690 |

FOREIGN PATENT DOCUMENTS

| | | | |
|---|---|---|---|
| JP | 09-063770 A | * | 3/1997 |

OTHER PUBLICATIONS

Marsitzky et al., Polymer Preprints, 42(1), p. 468–469, (2001).*

Burroughes et al, Light–emitting diodes based on conjugated polymers, Nature (1990), 347, p. 539–541.

Sheats etal, Organic Electroluminescent Devices, Science (1996), 273, p. 884–888.

Berggren et al, Light–emitting diodes with variable colours from polymer blends, Nature (1994), 372, p. 444–6.

Spreitzer et al, Soluble Phenyl–substituted PPVs–New Materials for Highly Efficient Polymer LEDs, Adv. Mater. 1998, 10(16) pp. 1340–1343.

Li et al, A blue light emitting copolymer with charge transporting and photo–crosslinkable functional units, Sny. Met.(1997,) vol. 84, pp. 437–438.

Yang et al, Polyaniline as a transparent electrode for polymer light–emitting diodes: Lower operating voltage and high efficiency, Appl. Phys. Lett.(1994), vol. 64, No. 10, pp. 1245–1247.

Groenendaal, et al, Poly(3,4–ethyelnedioxythiophene) and Its Derivatives: Past, Present and Future, Adv. Mater. (2000,) vol. 12, No. 7, pp. 481–494.

* cited by examiner

*Primary Examiner*—Dawn Garrett
(74) *Attorney, Agent, or Firm*—Raymond L. Owens

(57) ABSTRACT

An electroluminescent device includes an anode, a spaced-apart cathode, and polymer luminescent materials disposed between the anode and cathode, the polymeric luminescent materials includes pendant, 9,10-di-(2-naphthyl)anthracene-based polymers.

4 Claims, 2 Drawing Sheets

ELECTROLUMINESCENT DEVICES HAVING PENDANT NAPHTHYLANTHRACENE-BASED POLYMERS

FIELD OF THE INVENTION

The present invention relates to electroluminescent (EL) devices. More specifically, naphthylanthracene-based polymers used as luminescent materials in polymers EL devices.

BACKGROUND OF THE INVENTION

Electroluminescent devices are opto-electronic devices which light emission is produced in response to an electrical current through the device. The physical model for EL is the radiative recombination of electrons and holes. The term light emitting diode (LED) is commonly used to describe an EL device where the current-voltage behaviour is non-linear, meaning that the current through the EL device is dependent on the polarity of the voltage applied to the EL device. Both organic and inorganic materials have been used for the fabrication of LEDs. Inorganic materials such as ZnS/Sn, Ga/Bs, Ga/As have been used in semiconductor lasers, small area displays, LED lamps, etc. However, the drawbacks of inorganic materials include difficulties to process and to obtain large surface areas and efficient blue light.

Organic polymers used as light-emitting materials in EL devices offer several advantages over inorganic materials, such as simpler manufacturing, low operating voltages, the possibility of producing large area and full-color displays. Conjugated polymers such as poly(phenylvinylene) (PPV) were first introduced as EL materials by Burroughes et al in 1990 (Burroughes, J. H. *Nature* 1990, 347, 539). Considerable progress has been made since then to improve the stability, efficiency, and durability of polymeric LEDs (Sheats, J. R. et al *Science* 1996, 273, 884; Berggren, M. et al *Nature* 1994, 372, 444–6; Holmes, A. B. et al WO 94/29883 (1994); and Spreitzer, H. et al, *Adv. Mater.* 1998, 10(16), 1340). Polymers with wide energy bandgap to emit blue light are important materials because stable, efficient blue-light-emitting materials with high brightness are desirable for full color EL display applications. With these primary materials, it is possible to produce other colors by a downhill energy transfer process. For instance, a green or red EL emission can be obtained by doping a blue EL host material with a small amount of green or red luminescent material.

Incorporating an efficient chromophore into a polymer side chain is an effective approach to obtain blue light emitting polymer. The main chain of the polymer can provide necessary physical properties such as mechanical and film-forming properties and the side chain provides desired electro-optical properties. Blue-light-emitting polymers (Li et al. *Syn. Met.* 1997, 84, 437) have been prepared by this approach. However, the polymers show high threshold voltages and operating voltages. Thus, it is desirable to develop processable new blue-light-emitting polymers with low driving voltages for full color display.

SUMMARY OF THE INVENTION

It is an object of the present invention to provide wide energy bandgap luminescent polymeric materials useful for EL devices.

It is a further object of the present invention to provide wide energy bandgap luminescent polymers that emit blue light.

These objects are achieved in an EL device comprising an anode, a spaced-apart cathode, and polymer luminescent materials disposed between the anode and cathode, the polymer luminescent materials includes pendant 9,10-dinaphthylanthracene-based polymers having a repeating unit of the formula

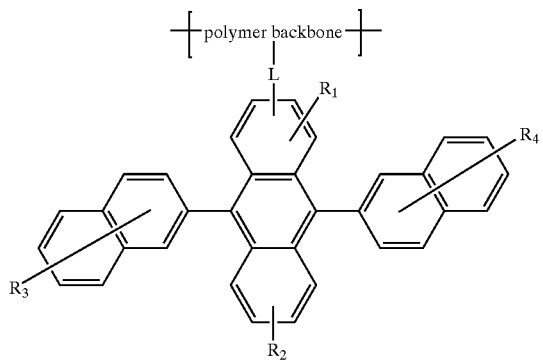

wherein:
$R_1$, $R_2$, $R_3$, and $R_4$ are the same or different, and are each individually hydrogen, or alkyl, or alkenyl, or alkynyl, or alkoxy, or amino wherein the alkyl, alkenyl, alkynyl, alkoxy or amino can have from 1 to 40 carbon atoms; or aryl of from 6 to 60 carbon atoms; or heteroaryl of from 4 to 60 carbons; or F, or Cl, or Br; or a cyano group; or a nitro group; and L is a direct bond between 9,10-dinaphthylanthracene and polymer backbone or a carbon linking group having 1 to 40 carbon atoms or a non-carbon linking group having 0 to 40 carbon atoms.

The present invention provides polymeric luminescent materials with a number of advantages which include good solubility and efficiency and better thermal stability. With the primary wide energy bandgap chromophore, 9,10-dinaphthylanthracene, other color emitting luminescent copolymers can be easily designed and produced by introducing the narrow energy bandgap chromorphores into the polymer chain.

DETAILED DESCRIPTION OF THE INVENTION

Figure 1:
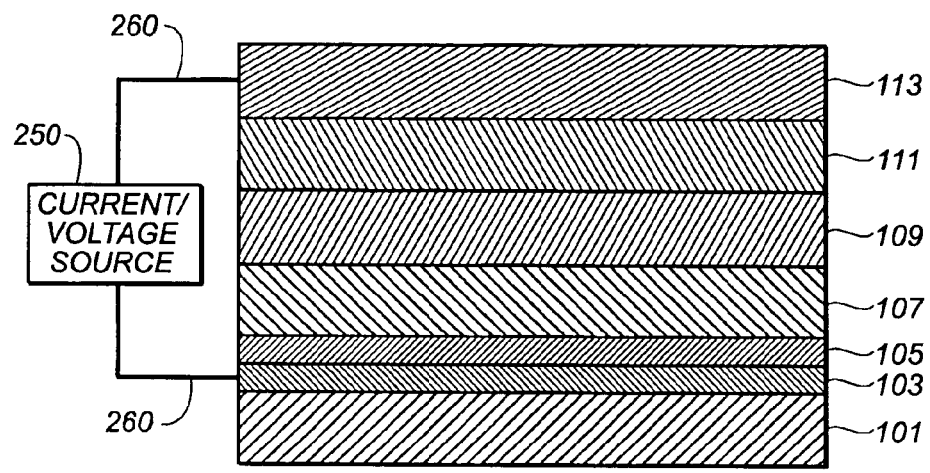
FIG. 1 illustrates in cross-section a basic structure of an EL device.

The chromophore 9,10-dinaphthylanthracene has been shown to be particularly useful for the fabrication of efficient and stable EL devices as disclosed in U.S. Pat. Nos. 5,935,721 and 6,361,887. Furthermore, 9,10-dinaphthylanthracene chromophore has a wide energy bandgap and emits blue light. By rotational design of a polymer structure, the green- or red-light-emitting polymer can be obtained through intramolecular downhill energy transfer in a copolymer.

The present invention provides highly efficient light-emitting polymers containing 9,10-dinaphthylanthracene with good solubility and thermal stability having the repeating units represented by the formula

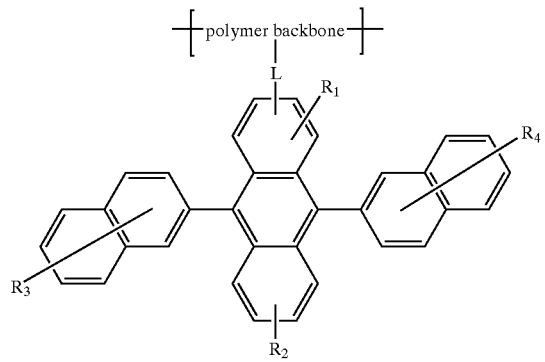

(I)

wherein:

$R_1$, $R_2$, $R_3$, and $R_4$ are the same or different, and are each individually hydrogen, or alkyl, or alkenyl, or alkynyl, or alkoxy, or amino wherein alkyl, alkenyl, alkynyl, alkoxy or amino can have from 1 to 40 carbon atoms; or aryl of from 6 to 60 carbon atoms; or heteroaryl of from 4 to 60 carbons; or F, or Cl, or Br; or a cyano group; or a nitro group; aryl of from 6 to 60 carbon atoms that includes phenyl, biphenyl, naphthyl, anthracene, fluorene, phenanthrene, spirophenyl, perylene, or pyrene groups; or heteroaryl of from 4 to 60 carbons that includes pyridine, thiophene, pyrrole, bithiophene, furan, benzofuran, benzimidazole, benzoxazole, quinoxaline, phenylquinoline, dipheyloxadizaole, or carbazole; or F, or Cl, or Br; or a cyano group; or a nitro group. For example, $R_1$, $R_2$, $R_3$, and $R_4$ represent hygrogen, methyl, ethyl, propyl, isopropyl, butyl, isobutyl, tbutyl, pentyl, hexyl, ethylhexyl, heptyl, octyl, nonyl, decyl, dodecyl, hexyadecyl, cyclohexyl, cyclopentyl, 3,7-dimethyloctyl, 3,7-dimethyloctyloxy, methoxy, ethoxy, butoxy, methoxyethyoxyethyl, methoxyethyloxyethoxyethyl, hexyloxy, ethylhexyloxy, diphenylamino, ditolylamino, di(4-t-butylphenyl)amino, phenyl, tolyl, naphthyl, xylene, anthracene, phenanthrene, phenylmethylenephenyl, benzyl, phenoxy, pyridyl, thiopheny. Preferably, $R_1$, $R_2$, $R_3$, and $R_4$ are hydrogen, t-butyl, phenyl, 2-ethylhexyloxy, n-hexyl, n-octyl, 3,7-dimethyloctyl, 3,7-dimethyloxctyloxy, diphenylamino, ditolylamino, di(4-t-butylphenyl)amino, or 4-methoxypheny.

L is a direct bond between 9,10-dinaphthylanthracene and polymer backbone or a carbon linking group having 1 to 40 carbon atoms or a non-carbon linking group having 0 to 40 carbon atoms. When L is a linking group, it includes alkyl, alkenyl, alkynyl, aryl, or heteroaryl; L may also contain O, N, S, F, Cl, or Br, or Si atoms. L includes but are not limited to the following groups:

Group I:
L is an ether, or thioether linking group:

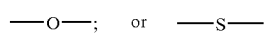

Group II:
L is an ester linking group:

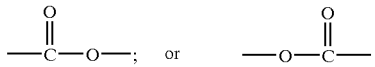

Group III:
L is an anhydride linking group:

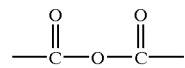

Group IV:
L is a carbonate linking group:

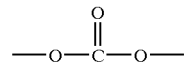

Group V:
L is a sulfone or sulfine linking group:

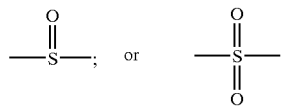

Group VI:
L is an amino or silo linking group;

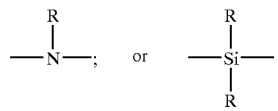

wherein:

R is hydrogen, or alkyl, or alkoxy wherein alkyl or alkoxy can have from 1 to 40 carbon atoms; or aryl or from 6 to 60 carbon atoms; or heteroaryl of from 4 to 60 carbons; or F, or Cl, or Br; or a cyano group; or a nitro group.

Group VII:
L is an amide linking group:

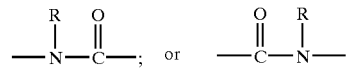

Group VIII:
L is a urea linking group:

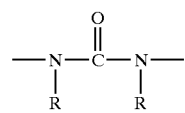

Group IX:
Li is an alkyl, alkenyl, or alkynyl group:

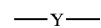

wherein:
Y contains 1 to 40 carbon atoms, may also contains O, N, S, F, Cl, Br, or Si atoms.

Group X:

L is an aryl or heteroaryl linking group:

$$-(Ar)_m-$$

wherein: Ar is an aryl group having 6 to 60 carbon atoms; or heteroaryl group having 4 to 60 carbon atoms, and at least one or more N, S, or O atoms; and m is an integer of 1 to 4.

The following structures constitute specific examples of L in Group X:

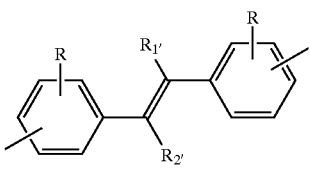

wherein:

$R_1'$ and $R_2'$ are the same or different, and are each individually hydrogen, or alkyl, or alkoxy wherein alkyl or alkoxy can have from 1 to 40 carbon atoms; or aryl of from 6 to 60 carbon atoms; or heteroaryl of from 4 to 60 carbons; or F, or Cl, or Br; or a cyano group; or a nitro group;

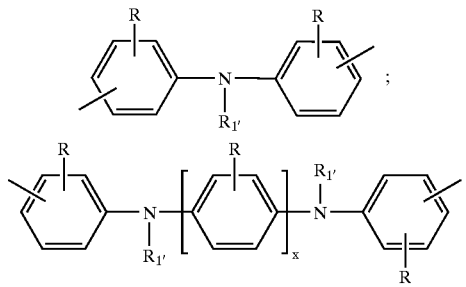

wherein: x is an integer of 1 to 3;

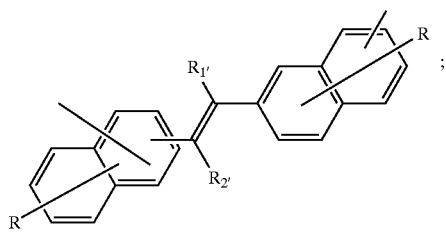

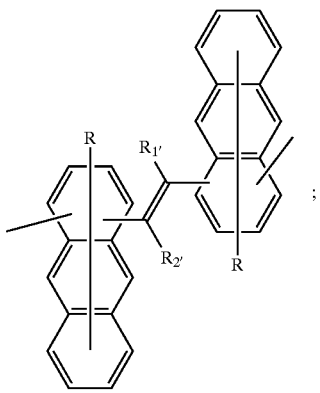

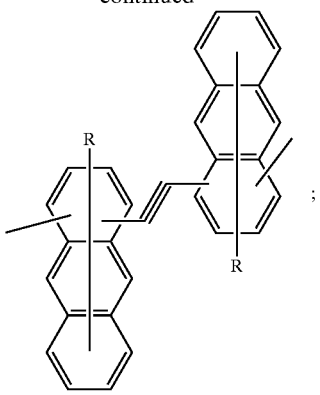

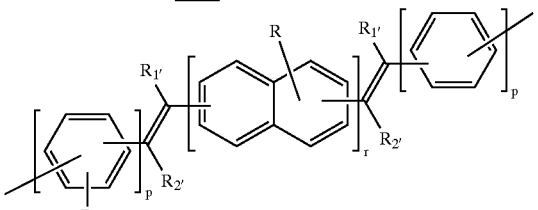

wherein: p and r are integers from 1 to 4;

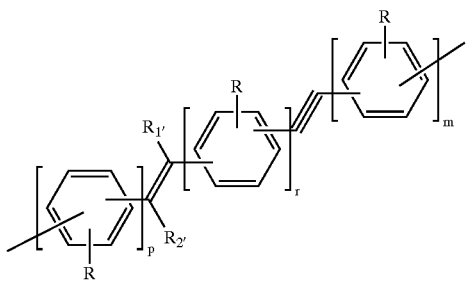

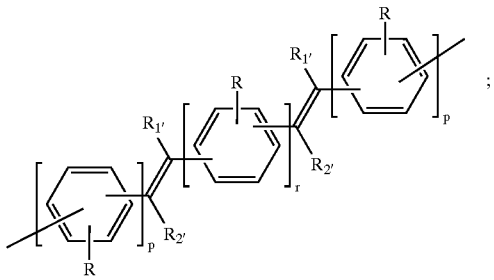

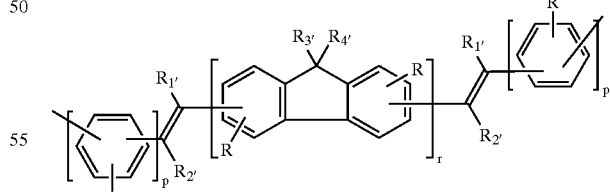

wherein:

$R_3'$ and $R_4'$ are substituents each being individually hydrogen, or alkyl, or alkenyl, or alkynyl, or alkoxy wherein alkyl, alkenyl, or alkynyl, or alkoxy can have from 1 to 40 carbon atoms; or aryl of from 6 to 60 carbon atoms; or heteroaryl of from 4 to 60 carbons; or F, Cl, or Br; or a cyano group; or a nitro group;

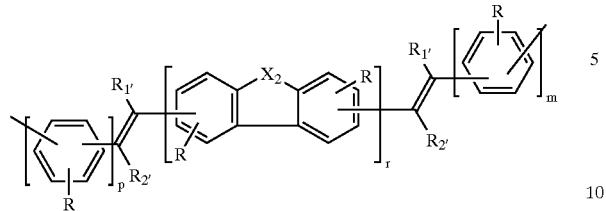
wherein
 $X_2$ is S, Se, or O atom, $SiR_2$, or N-R;
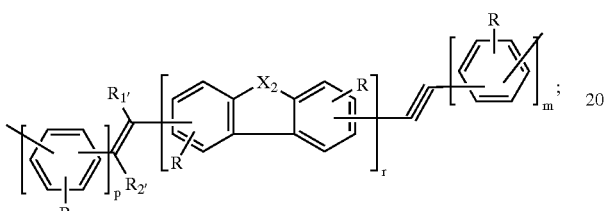
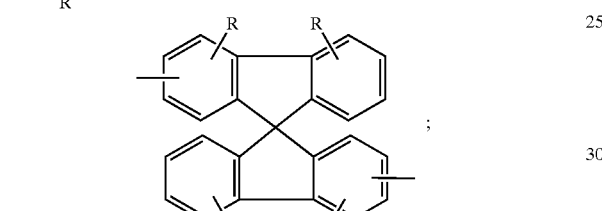
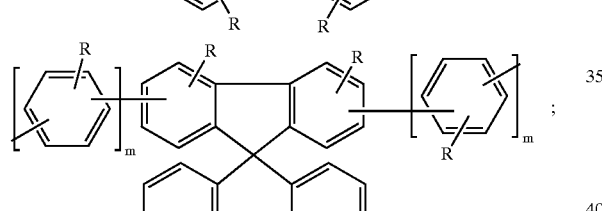
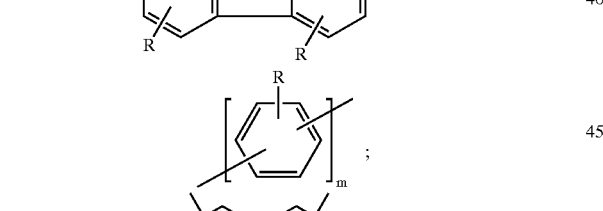
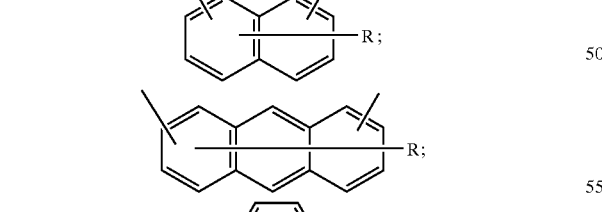
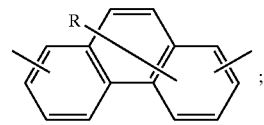
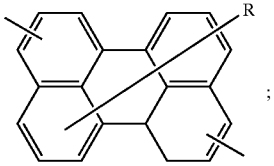
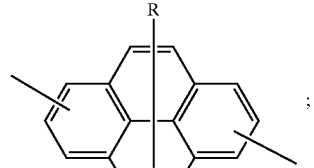
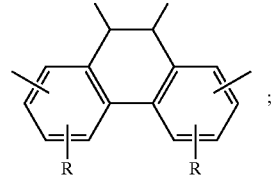
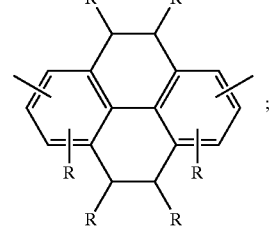
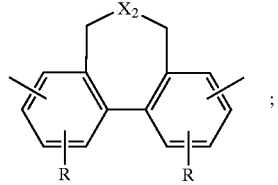
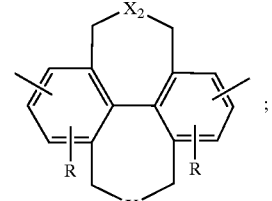
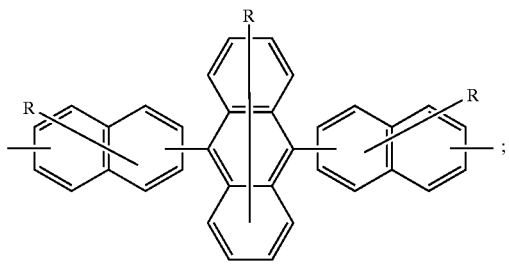

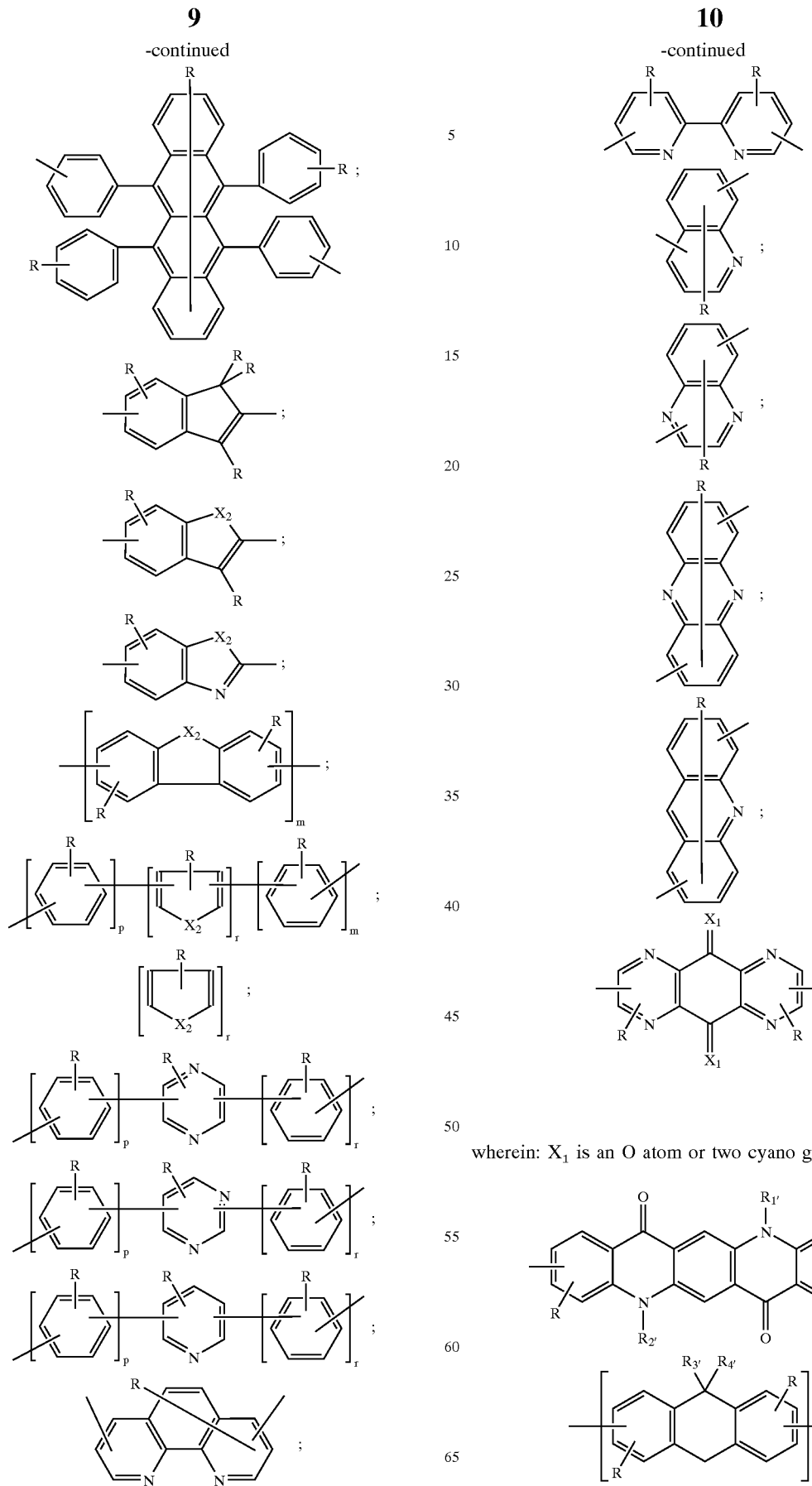
wherein: $X_1$ is an O atom or two cyano groups;
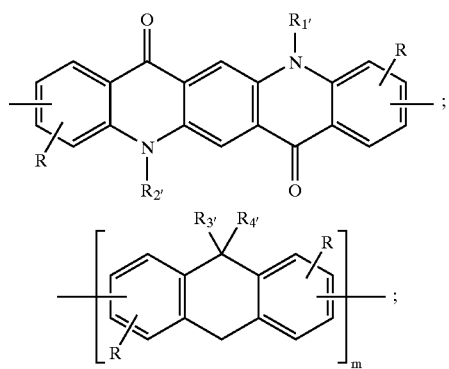

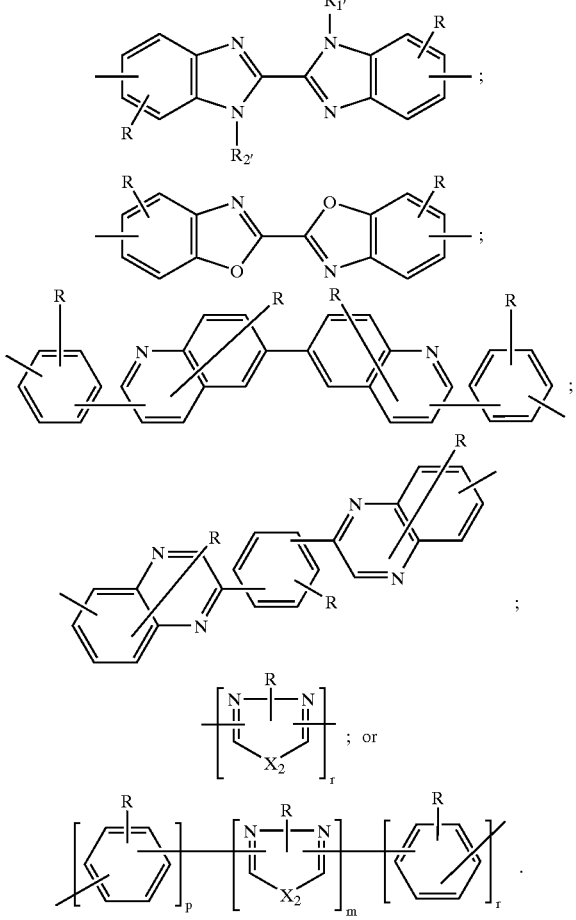

L can be one or the combination of more than one of the above groups.

The polymer backbone can be vinyl polymer backbone, polyether, polyacetyl, polycarbonate, polyurethane, polyimide, polyamide, polyurea, polyester, polyketone, polysiloxane, polyarene, poly(arylene vinylene), or poly(arylene acetylene).

The following molecular structures constitute specific examples of the preferred polymers satisfying the requirement of this invention:

polymer 1 polymer 2

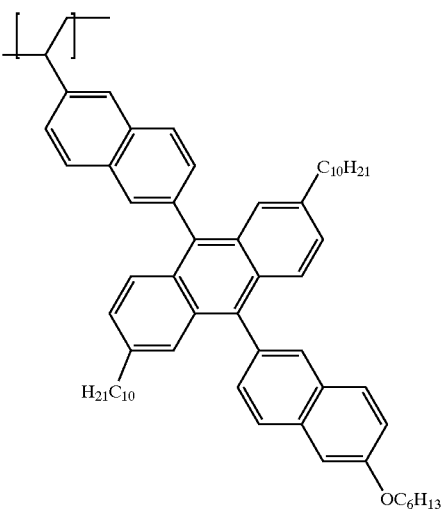

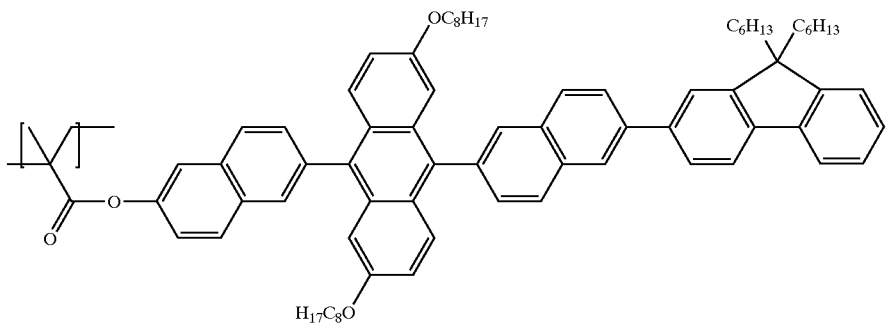

polymer 3
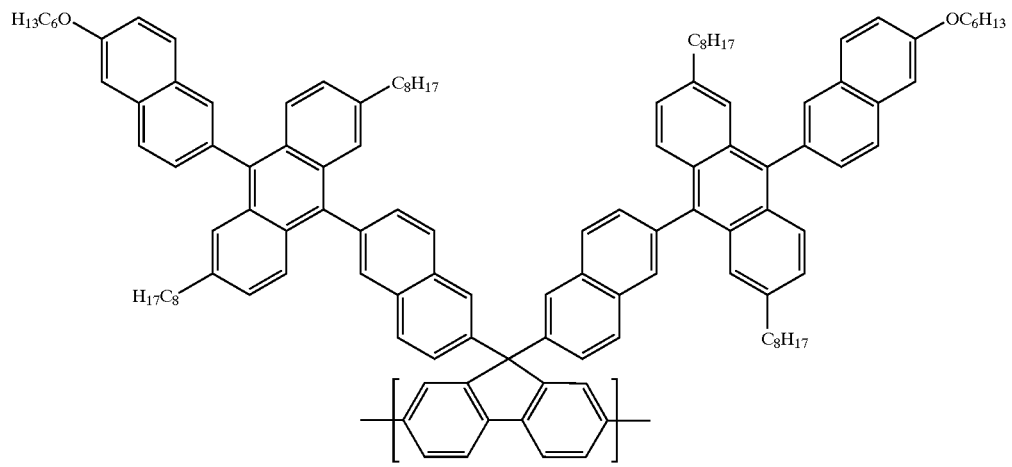
polymer 4
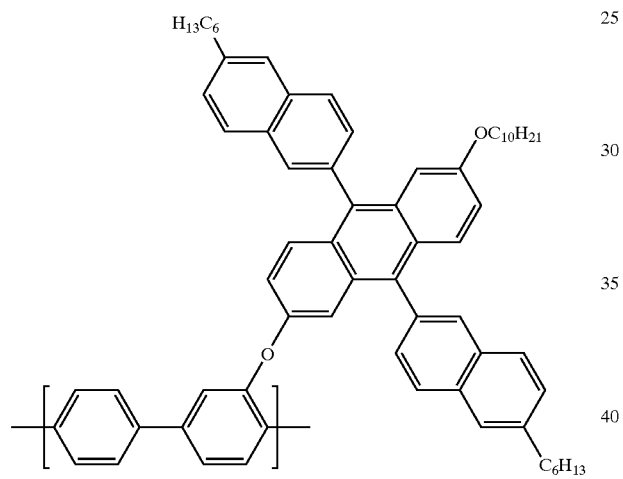
polymer 5
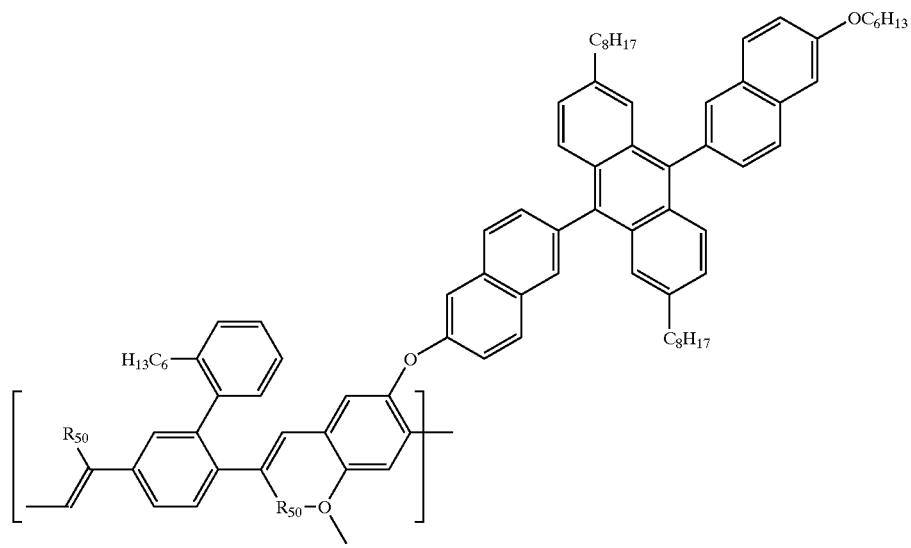

polymer 6 R$_{50}$=H
polymer 7 R$_{50}$=CN
polymer 8 R$_{30}$=phenyl
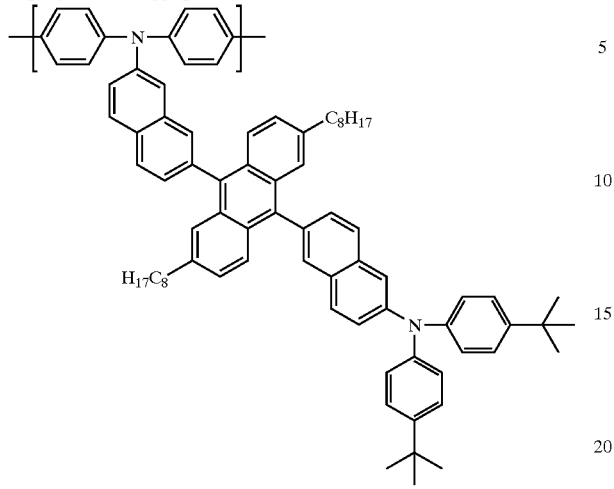
polymer 9
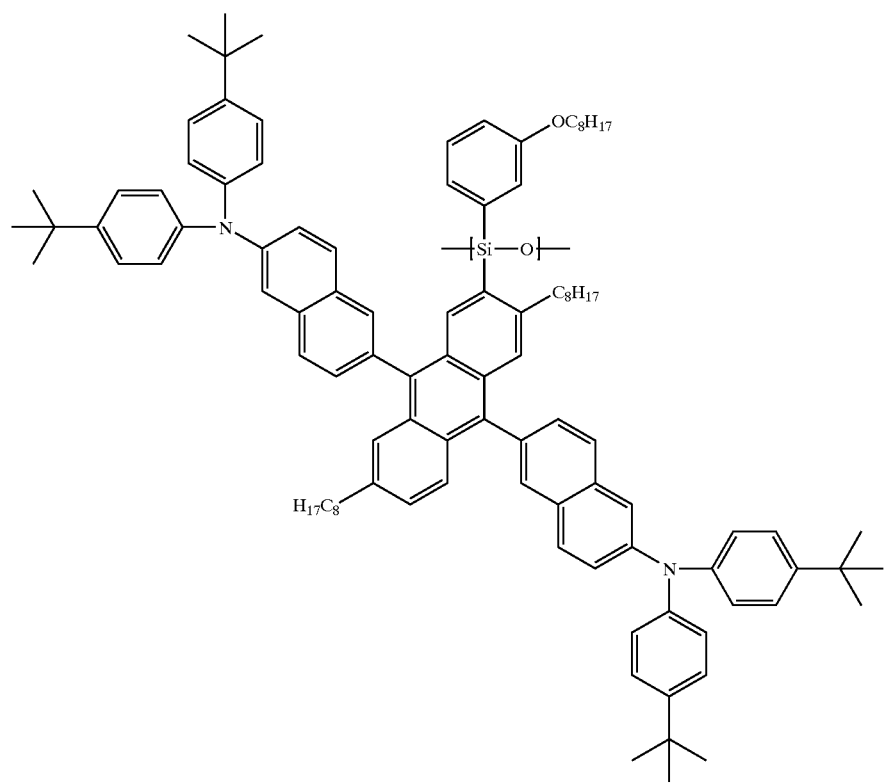

polymer 10
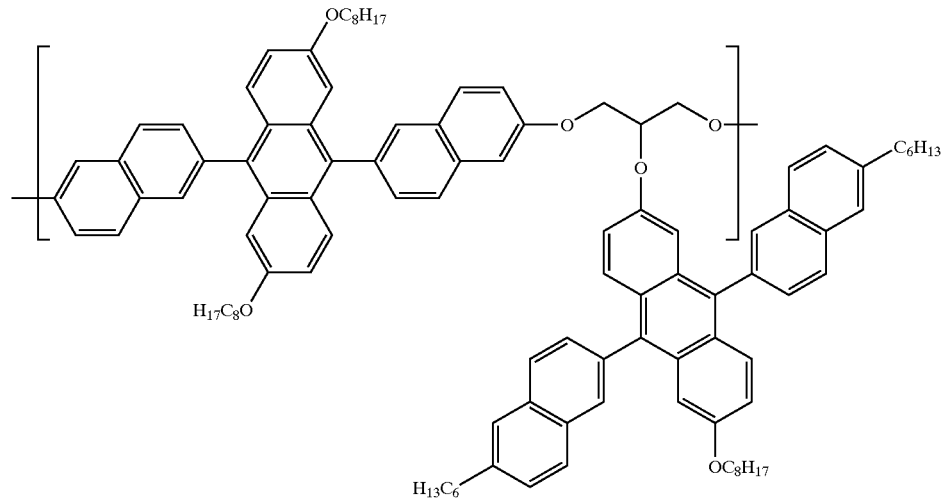
polymer 11
polymer 12
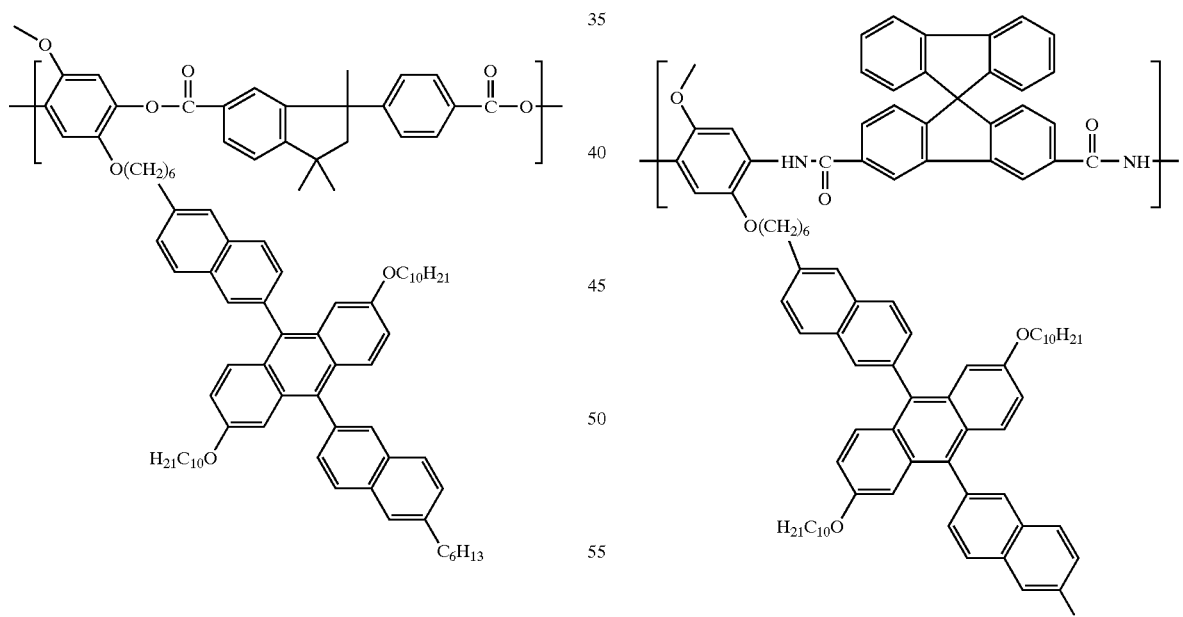

polymer 13
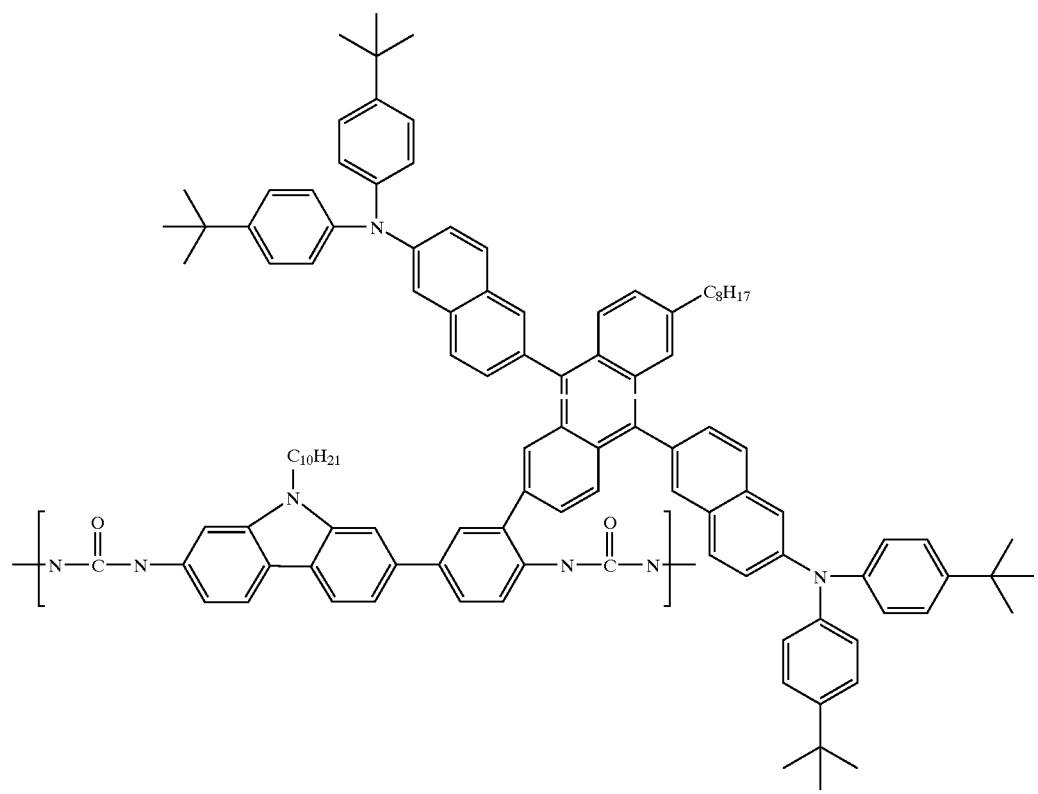
polymer 14
polymer 15
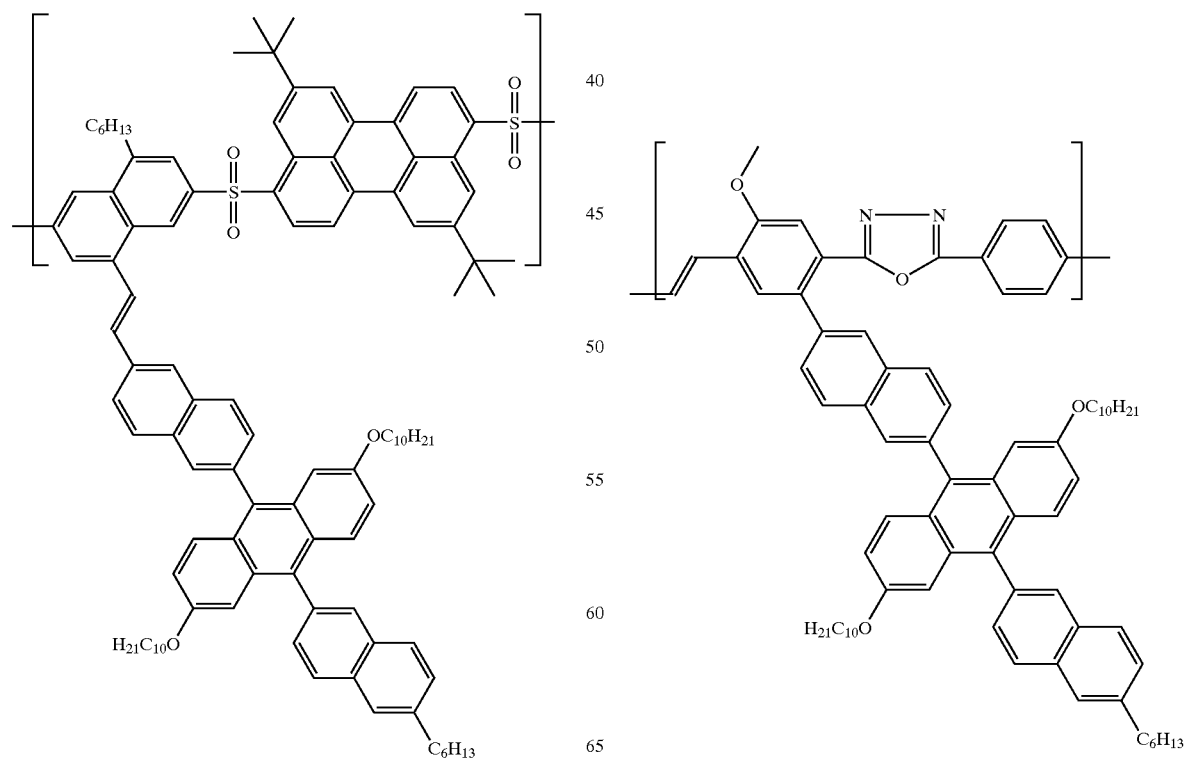

polymer 16
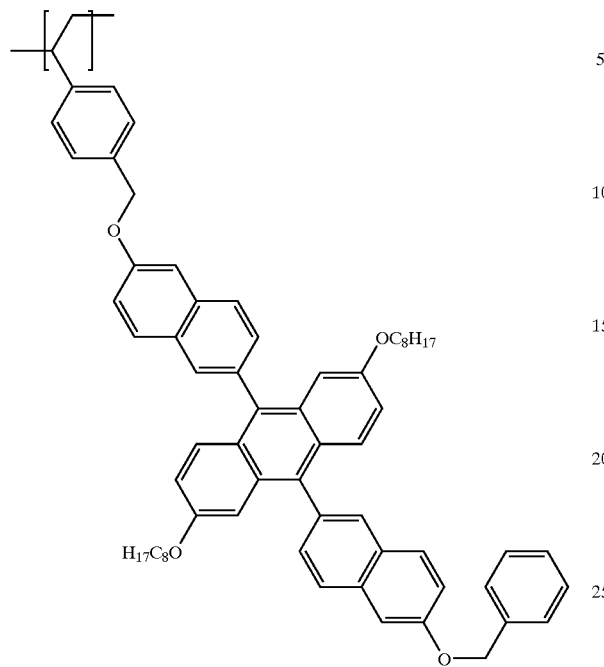
polymer 17
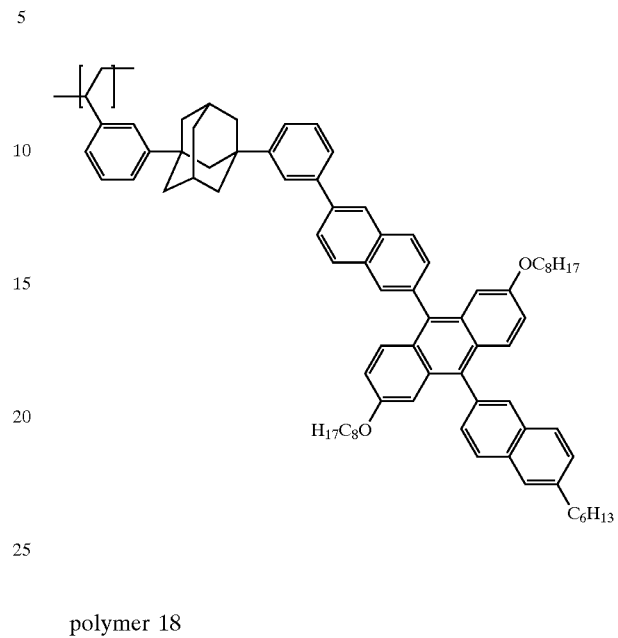
polymer 18
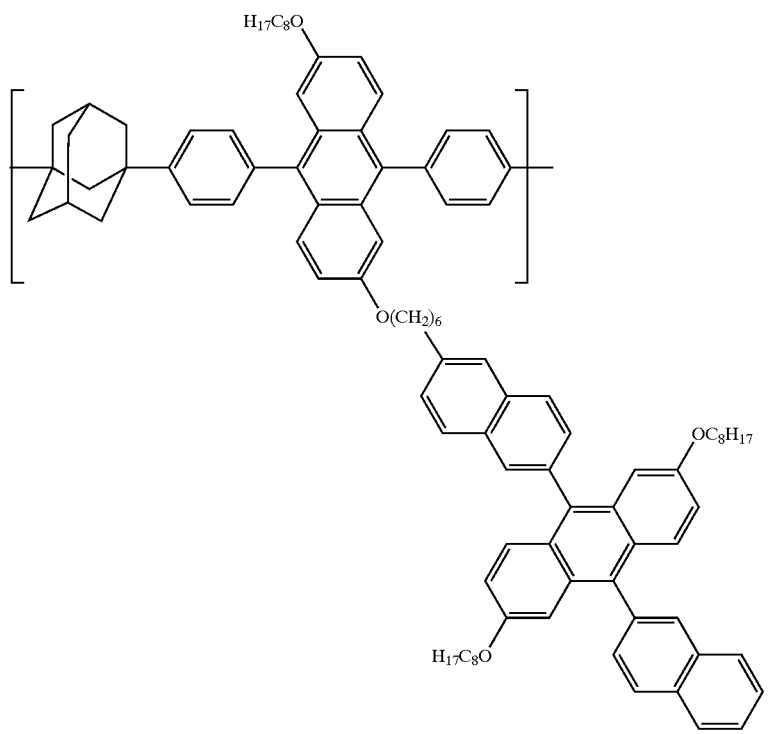

polymer 19
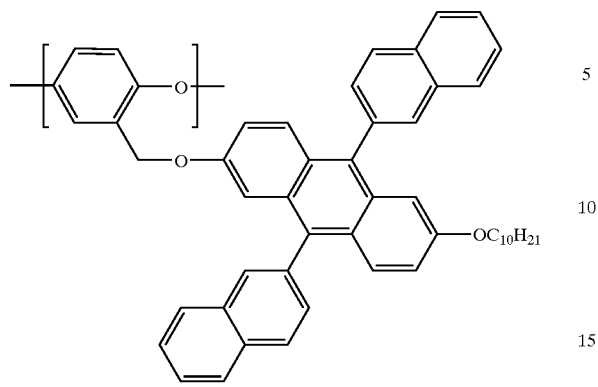
polymer 20
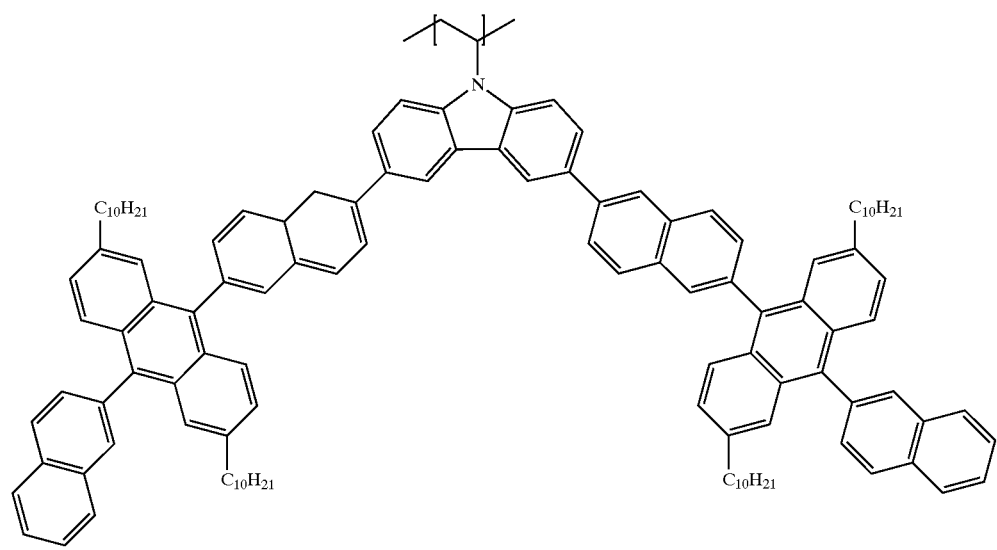
polymer 21
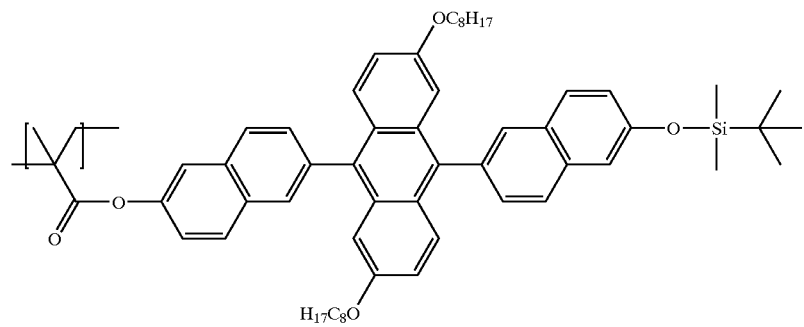

polymer 22
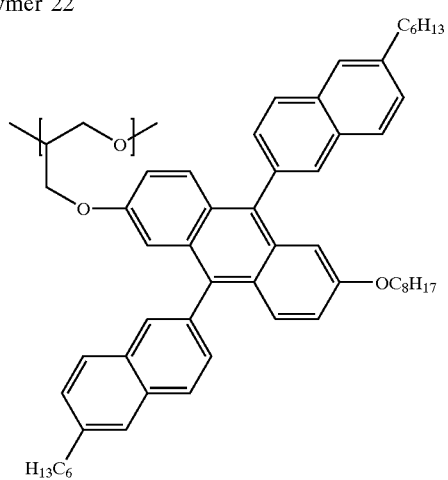
polymer 24
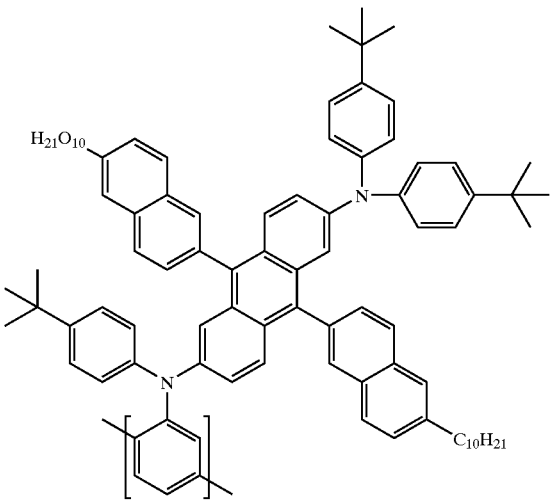
polymer 23
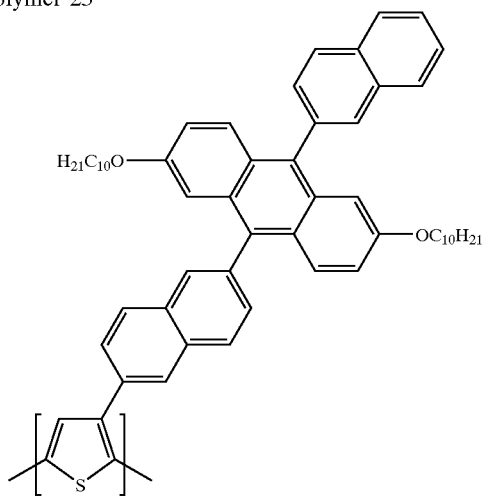
polymer 25
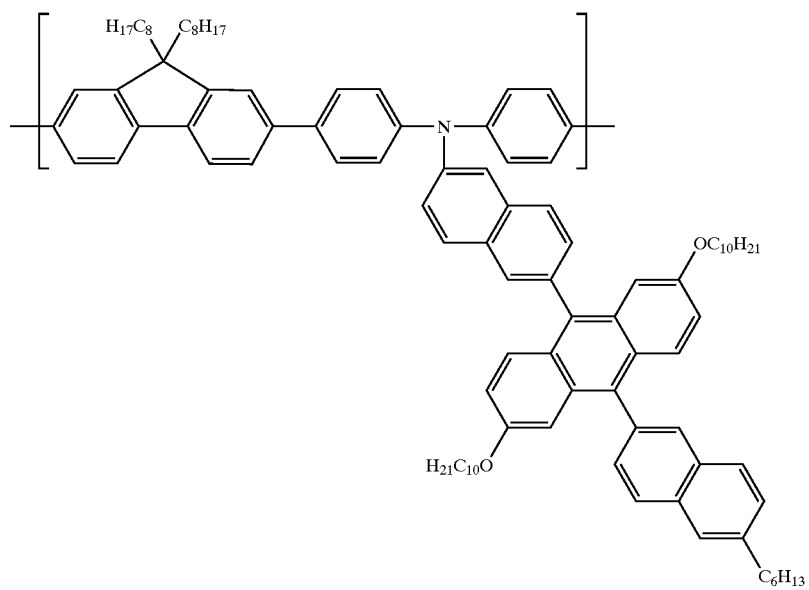

polymer 26
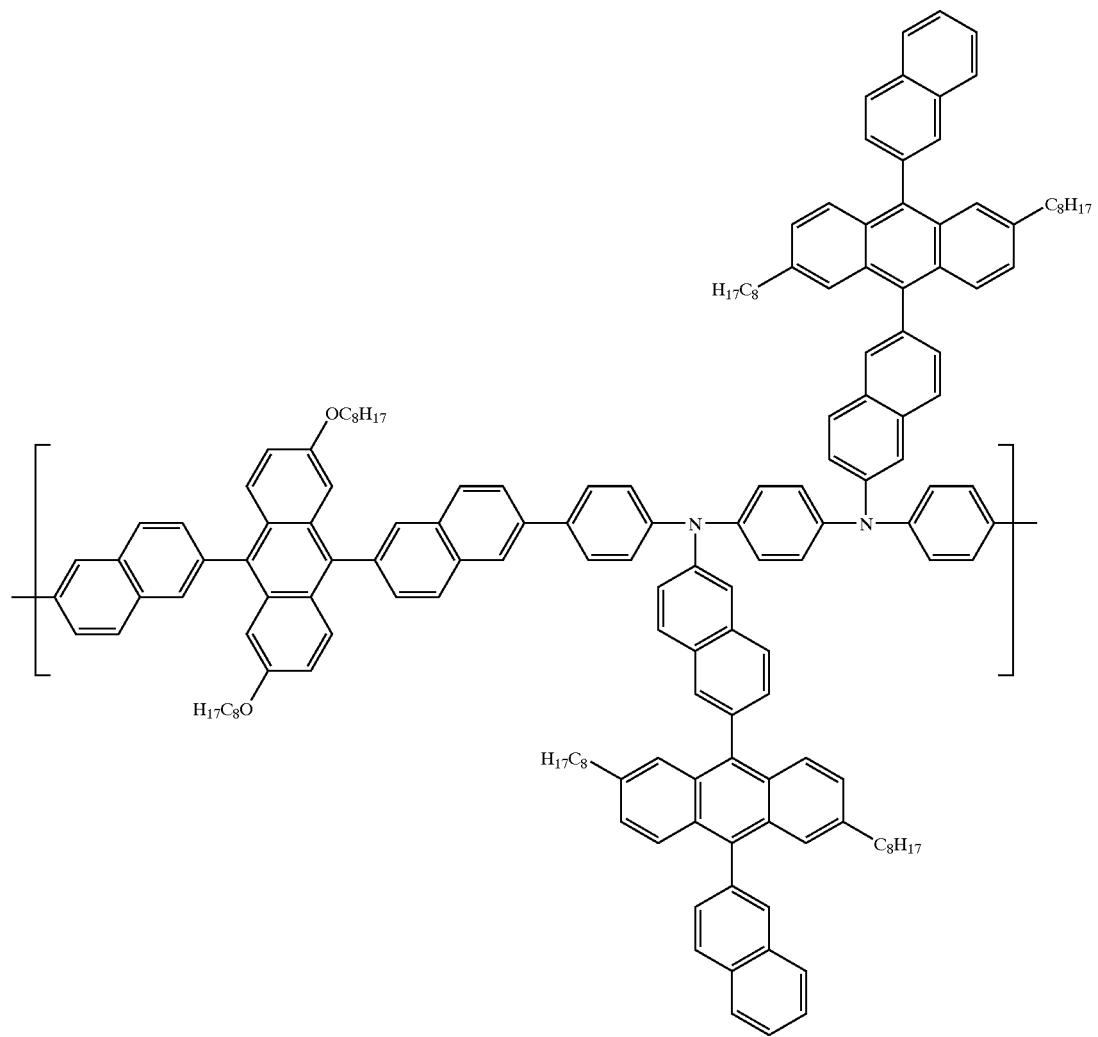

polymer 27
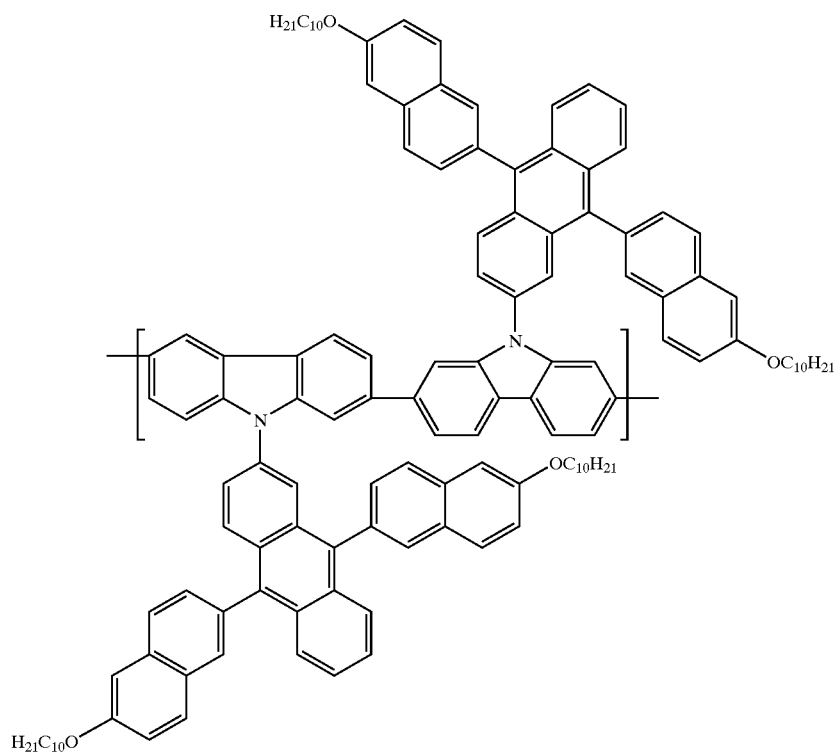
polymer 28
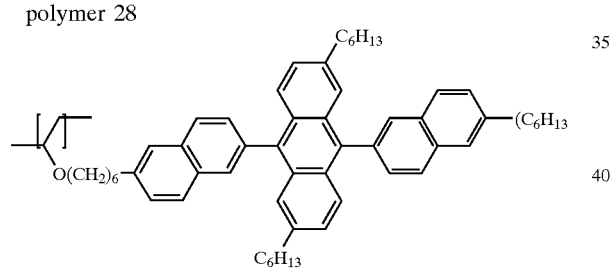
polymer 29
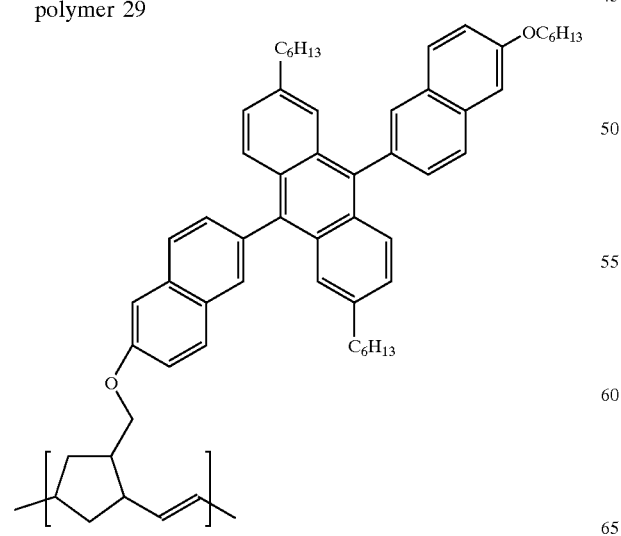

polymer 30

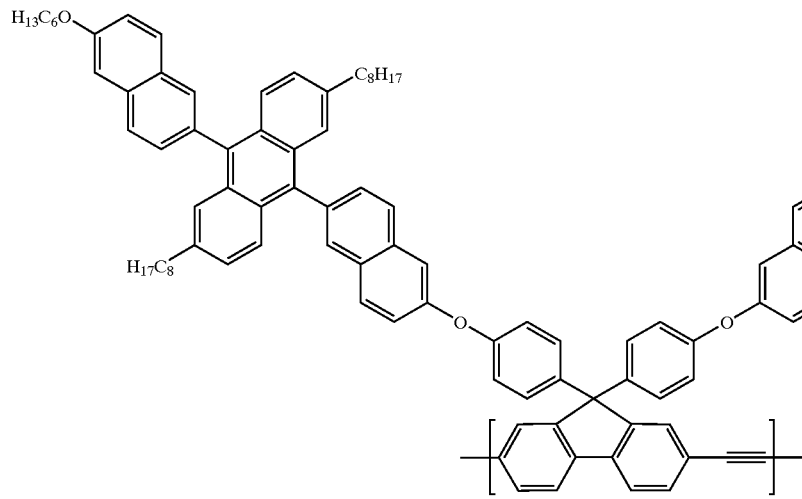
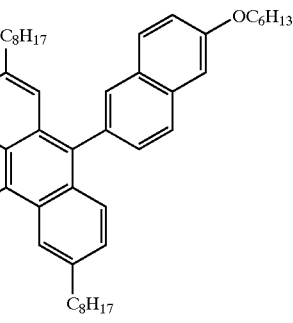

polymer 31

The specific molecular structures can be the combination of any of the above drawn structures.

The polymers comprising dinaphthylanthracene moiety of repeating units of formula described above can be synthesized using known methods. The polymerization method and the molecular weights of the resulting polymers used in the present invention are not necessary to be particularly restricted. The molecular weights of the polymers are at least 1000, and preferably at least 2000. The polymers may be prepared by condensation polymerizations, such as coupling reactions including Pd-catalyzed Suzuki coupling, Stille coupling or Heck coupling, or Ni-mediated Yamamoto coupling, or Wittig reaction, or Horner-Emmons reaction, or Knoevenagel reaction, or dehalogenation of dibenzyl halides, or by other condensation methods to make the polyester, polyketone, polyamide, or polyester ketone, or ring opening polymerization, or free radical polymerization, or cationic polymerization or anionic polymerization. Preferably the polymers are prepared by free radical polyemerization.

The synthetic scheme of the polymers according to the present invention is illustrated in Scheme 1.

The process of the invention provides polymers particularly useful for an optical device. The optical device may comprise a luminescent device such as an EL device in which the polymers of the present invention is deposited between a cathode and spaced-apart anode. The polymers can be deposited as thin film by vapor deposition method or thermal transfer, or from a solution by spin-coating, spray-coating, dip-coating, roller-coating, or ink jet delivery. The thin film may be supported by substrate directly, preferably a transparent substrate, or supported by the substrate indirectly where there is one or more inter layers between the substrate and thin film. The thin film can be used as emitting layer or charge carrier transporting layer.

General EL device architecture:

The present invention can be employed in most organic EL device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. A typical structure is shown in FIG. 1 includes a substrate 101, an anode 103, a hole-injecting layer 105, a hole-transporting layer 107, a light-emitting layer 109, an electron-transporting layer 111, and a cathode 113. These layers are described in detail below. This figure is for illustration only and the individual layer thickness is not scaled according to the actual thickness. Note that the substrate 101 may alternatively be located adjacent to the cathode 113, or the substrate 101 may actually constitute the anode 103 or cathode 113. The organic layers between the anode 101 and cathode 113 are conveniently referred to as the organic EL element.

The anode 103 and cathode 113 of the OLED are connected to a voltage/current source 250 through electrical conductors 260. The OLED is operated by applying a potential between the anode 103 and cathode 113 such that the anode 103 is at a more positive potential than the cathode 113. Holes are injected into the organic EL element from the anode 103 and electrons are injected into the organic EL element at the anode 103. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

Substrate:

The OLED device of this invention is typically provided over a supporting substrate 101 where either the cathode 113 or anode 103 can be in contact with the substrate 101. The electrode in contact with the substrate 101 is conveniently referred to as the bottom electrode. Conventionally, the bottom electrode is the anode, but this invention is not limited to that configuration. The substrate 101 can either be light transmissive or opaque, depending on the intended direction of light emission. The light transmissive property is desirable for viewing the EL emission through the substrate 101. Transparent glass or plastic is commonly employed in such cases. The substrate 101 may be a complex structure including multiple layers of materials. This is typically the case for active matrix substrates wherein TFTs are provided below the EL layers. It is still necessary that the substrate 101, at least in the emissive pixilated areas, include largely transparent materials such as glass or polymers. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Again, the substrate may be a complex structure comprising multiple layers of materials such as found in active matrix TFT designs. Of course it is necessary to provide in these device configurations a light-transparent top electrode.

Anode:

When EL emission is viewed through anode 103, the anode 103 should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode 103. Anode 103 can be modified with plasma-deposited fluorocarbons as disclosed EP 0914025. For applications where EL emission is viewed only through the cathode electrode, the transmissive characteristics of the anode 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

Hole-Injection Layer (HIL):

While not always necessary, it is often useful that a hole-injecting layer 105 be provided between anode 103 and hole-transporting layer 107. The hole-injecting material can serve to improve the film formation property of subsequent organic layers and to facilitate injection of holes into the hole-transporting layer 107. Suitable materials for use in the hole-injecting layer 105 include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-methylphenyl)phenylamino]triphenylamine). Alternative hole-injecting materials reportedly useful in organic EL devices are described in EP 0 891 121 A1 and EP 1 029 909 A1.

Hole-Transporting Layer (HTL)

The hole-transporting layer 107 of the organic EL device in general contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural formula (A).

(A)

wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

(B)

wherein:

$R_{15}$ and $R_{16}$ each independently represents a hydrogen atom, an aryl group, or an alkyl group or $R_{15}$ and $R_{16}$ together represent the atoms completing a cycloalkyl group; and $R_{17}$ and $R_{18}$ each independently represents an aryl group, which is in turn substituted with a diaryl substituted amino group, as indicated by structural formula (C):

(C)

wherein $R_{19}$ and $R_{20}$ are independently selected aryl groups. In one embodiment, at least one of $R_{19}$ or $R_{20}$ contains a polycyclic fused ring structure, e.g., a naphthalene.

Another class of aromatic tertiary amines are the tetraaryldiamines. Desirable tetraaryldiamines include two diarylamino groups, such as indicated by formula (C), linked through an arylene group. Useful tetraaryldiamines include those represented by formula (D):

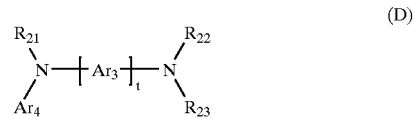

(D)

wherein each $Ar_3$ is an independently selected arylene group, such as a phenylene or anthracene moiety, t is an integer of from 1 to 4, and $Ar_4$, $R_{21}$, $R_{22}$, and $R_{23}$ are independently selected aryl groups.

In a typical embodiment, at least one of $Ar_4$, $R_{21}$, $R_{22}$, and $R_{23}$ is a polycyclic fused ring structure, e.g., a naphthalene The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—eg, cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specially, one may employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4-(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tri[(3-methylphenyl)phenylamino]triphenylamine Another class of useful hole-transporting materials includes polycyclic aromatic compounds as described in EP 1 009 041. Tertiary aromatic amines with more than two amine groups may be used including oligomeric materials. In addition, polymeric hole-transporting/hole injection materials can be used such as poly(N-vinylcarbazole) (PVK), polythiophenes, polypyrrole, polyaniline (Yang, Y. et al. *Appl. Phys. Lett.* 1994, 64, 1245) and copolymers such as poly(3,4-ethylenedioxythiophene)/poly(4-styrenesulfonate) also called PEDOT/PSS(Groenendaal, L. B. et al. *Adv. Mater.* 2000, 12, 481).

Light-Emitting Layer (LEL)

As more fully described in U.S. Pat. Nos. 4,769,292 and 5,935,721, the light-emitting layer (LEL) 109 of the organic EL element includes a luminescent or fluorescent material where electroluminescence is produced as a result of electron-hole pair recombination in this region. The light-emitting layer 109 can include a single material including both small molecules and polymers. For small molecules, more commonly the LEL 109 consists of a host material doped with a guest compound or compounds where light emission comes primarily from the dopant and can be of any color. The host materials in the light-emitting layer 109 can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Simultaneously, the color of the EL devices can be tuned using dopants of different emission wavelengths. By using a mixture of dopants, EL color characteristics of the combined spectra of the individual dopant are produced. This dopant scheme has been described in considerable detail for EL devices in U.S. Pat. No. 4,769,292 for fluorescent dyes. Dopants are typically coated as 0.01 to 10% by weight into the host material. Polymeric materials such as polyfluorenes and poly(arylene vinylenes) (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital (HOMO) and the lowest unoccupied molecular orbital (LUMO) of the molecule. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

For small molecules, host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721, and 6,020,078.

For example, small molecule metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

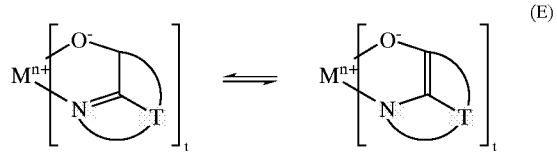

(E)

wherein:

M represents a metal;

t is an integer of from 1 to 4; and

T independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be useful chelating metal can be employed.

T completes a heterocyclic nucleus containing at least two fused aromatic rings, at least one of which is an azole or azine ring. Additional rings, including both aliphatic and aromatic rings, can be used with the two required rings, if required. To avoid adding molecular bulk without improving on function the number of ring atoms is usually maintained at 18 or less.

Illustrative of useful chelated oxinoid compounds are the following:

CO-1: Aluminum trisozine [alias, tris(8-quinolinolato) aluminum(III)]

CO-2: Magnesium bisoxine [alias, bis(8-quinolinolato) magnesium(II)]

CO-3: Bis[benzo{f}-8-quinolinolato]zinc (II)

CO-4: Bis(2-methyl-8-quinolinolato)aluminum (III)-μ-oxo-bis(2-methyl-8-quinolinolato) aluminum(III)

CO-5: Indium trisoxine [alias, tris(8-quinolinolato) indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato) zirconium(IC)]

Derivatives of 9,10-dinaphthylanthracene (Formula F) constitute one class of useful hosts capable of supporting electroluminescence, and are particularly suitable for light emission of wavelengths longer than 400 nm, e.g., blue, green, yellow, orange or red.

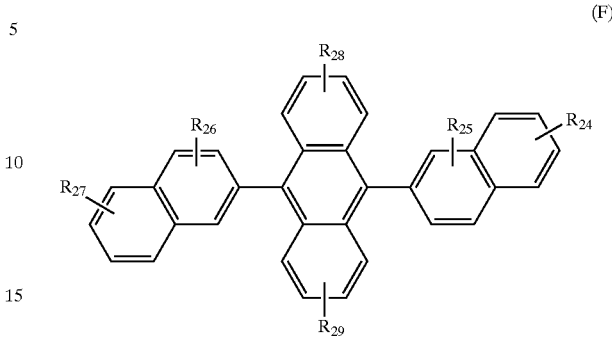

(F)

wherein: $R_{24}$, $R_{25}$, $R_{26}$, $R_{27}$, $R_{28}$, and $R_{29}$ represent one or more substituents on each ring where each substituent is individually selected from the following groups:

Group 1: hydrogen, or alkyl of from 1 to 24 carbon atoms;

Group 2: aryl of from 6 to 20 carbon atoms, or heteroaryl of from 5 to 20 carbon atoms Group 3: carbon atoms from 4 to 24 necessary to complete a fused aromatic ring of anthracenyl; pyrenyl, or perylenyl;

Group 4: heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Illustrative examples include 9,10-di-(2-naphthyl) anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene.

Distyrylarylene derivatives are also useful hosts, as described in U.S. Pat. No. 5,121,029. Carbazole derivatives are particularly useful hosts for phosphorescent emitters.

Useful fluorescent dopants (FD) include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds. Useful phosphorescent dopants (PD) include but are not limited to organometallic complexes of transition metals of iridium, platinum, palladium, or osmium. Illustrative examples of useful dopants include, but are not limited to, the following:

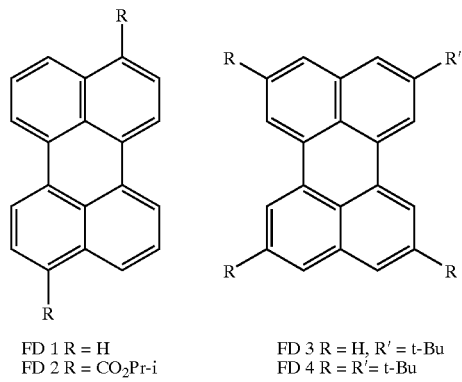

FD 1 R = H
FD 2 R = CO₂Pr-i

FD 3 R = H, R' = t-Bu
FD 4 R = R'= t-Bu

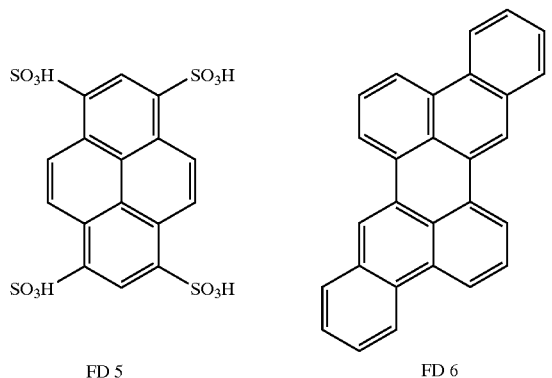

FD 5

FD 6

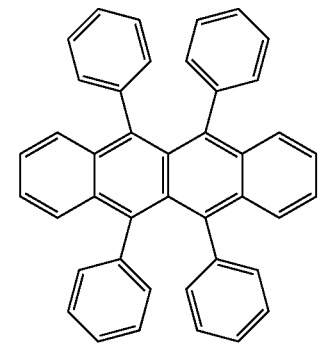

FD 7

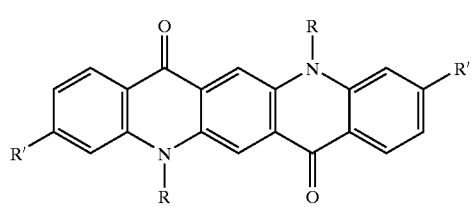

FD 8 R = R' = H
FD 9 R = Me, R' = H
FD 10 R = Pr-i, R' =H
FD 11 R = Me, R' = F
FD 12 R = phenyl, R' = H

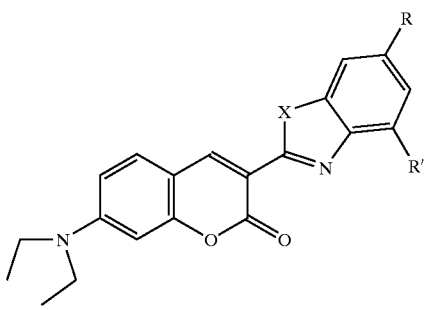

FD 13 R = R' = H, X = O
FD 14 R = H, R' = Me, X = O
FD 15 R = Me, R' = H, X = O
FD 16 R = Me, R' = Me, X = O
FD 17 R = H, R' = t-Bu, X = O
FD 18 R = t-Bu, R' = H, X = O
FD 19 R = R'= t-Bu, X = O
FD 20 R = R' = H, X = S
FD 21 R = H, R' = Me, X = S
FD 22 R = Me, R' = H, X = S
FD 23 R = Me, R' = Me, X = S
FD 24 R = H, R' = t-Bu, X = S
FD 25 R = t-Bu, R' = H, X = S
FD 26 R = R' = t-Bu, X = S

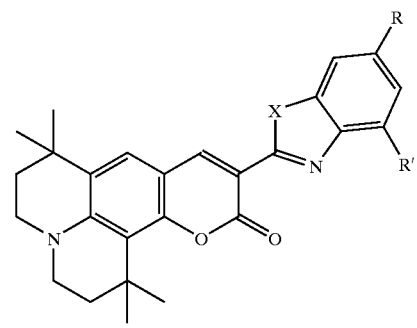

FD 27 R = R' = H, X = O
FD 28 R = H, R' = Me, X = O
FD 29 R = Me, R' = H, X = O
FD 30 R = Me, R' = Me, X = O
FD 31 R = H, R' = t-Bu, X = O
FD 32 R = t-Bu, R' = H, X = O
FD 33 R = R' = t-Bu, X = O
FD 34 R = R' = H, X = S
FD 35 R = H, R' = Me, X = S
FD 36 R = Me, R' = H, X = S
FD 37 R = Me, R' = Me, X = S
FD 38 R = H, R' = t-Bu, X = S
FD 39 R = t-Bu, R' = H, X = S
FD 40 R = R' = t-Bu, X = S

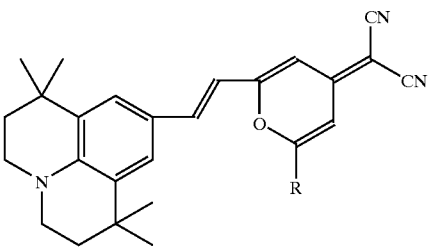

FD 41 R = phenyl
FD 42 R = Me
FD 43 R = t-Bu
FD 44 R = mesityl

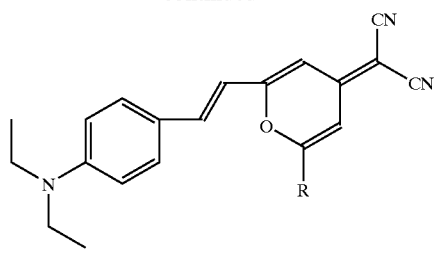
FD 45 R = phenyl
FD 46 R = Me
FD 47 R = t-Bu
FD 48 R = mesityl
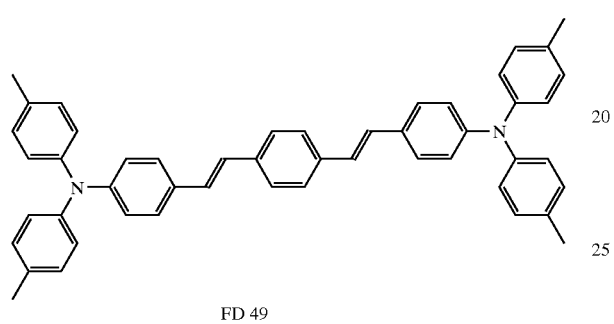
FD 49
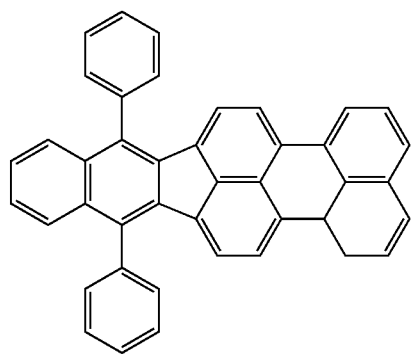
FD 50
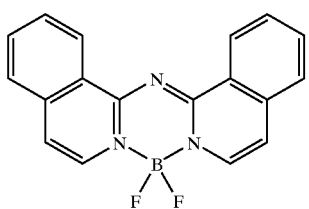
FD 51
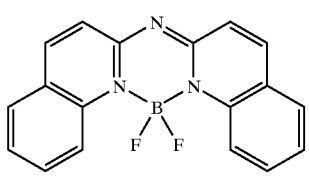
FD 52
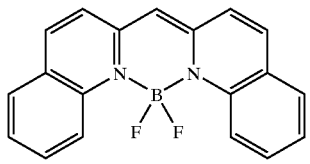
FD 53
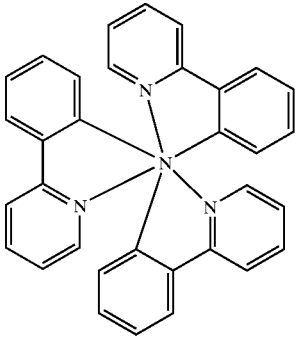
PD 1 (Ir(PPY)$_3$)
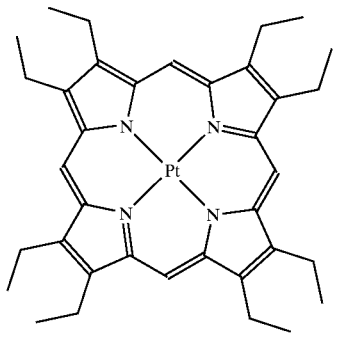
PD 2
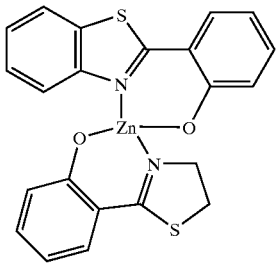
PD 3
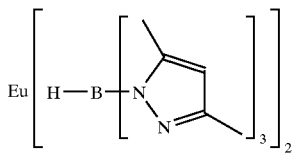
PD 4
Electron-Transporting Layer (ETL):
Preferred thin film-forming materials for use in forming the electron-transporting layer 111 of the organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Triazines are also known to be useful as electron transporting materials. Oxadiazole compounds including small molecules and polymers are useful electron transporting materials as described in U.S. Pat. No. 6,451,457.

Cathode:

When light emission is viewed solely through the anode 103, the cathode 113 used in this invention can include nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211; 5,247,190; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459; 6,278,236; 6,284,393, EP 1 076 368, and JP 3,234,963. Cathode materials are typically deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Other Useful Organic Layers and Device Architecture

In some instances, layers 109 and 111 can optionally be collapsed into a single layer that serves the function of supporting both light emission and electron transportation, or layers 107 and 109 can optionally be collapsed into a single layer that serves the function of supporting both light emission and hole transportation. Alternatively, layers 107, 109 and 111 can optionally be collapsed into a single layer that serves the function of supporting both light emission and hole and electron transportation. This is the preferred EL device structure of this invention and is referred to as "single-layer" device.

It also known in the art that emitting dopants may be added to the hole-transporting layer, which may serve as a host. Multiple dopants may be added to one or more layer in order to create a white-emitting EL device, for example, by combining blue- and yellow-emitting materials, cyan- and red-emitting materials, or red-, green-, and blue-emitting materials. White-emitting devices are described, for example, in EP 1 187 235 and EP 1 182 244 and U.S. Published patent application No. 20020025419, U.S. Pat. Nos. 5,683,823; 5,503,910; 5,405,709, and 5,283,182.

Additional layers such as electron or hole-blocking layers as taught in the art may be employed in devices of this invention. Hole-blocking layers are commonly used to improve efficiency of phosphorescent emitter devices, for example, as in U.S. Published patent application No. 20020015859.

This invention may be used in so-called stacked device architecture, for example, as taught in U.S. Pat. Nos. 5,703, 436 and 6,337,492.

Deposition of Organic Layers

The organic materials mentioned above can be deposited as high quality transparent thin films by various methods such as a vapor deposition or sublimation method, an electron-beam method, a sputtering method, a thermal transferring method, a molecular lamination method and a coating method such as solution casting, spin-coating or inkjet printing, with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237, 529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294, 870), spatially-defined thermal dye transfer from a donor sheet (U.S. Pat. No. 5,688,551; 5,851,709 and 6,066,357) and inkjet method (U.S. Pat. No. 6,066,357).

Preferably, the spin-coating or inkjet printing technique is used to deposit the polymer of the invention, and only one polymer is deposited in a single layer device.

Encapsulation:

Most organic EL devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Telfon, and alternating inorganic/polymeric layers are known in the art for encapsulation.

Optical Optimization:

Organic EL devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

EXAMPLES

The invention and its advantages are further illustrated by the following specific examples:

Synthesis of Monomers

The monomers to be used in the present invention to construct polymers are not necessary to be particularly restricted. Any monomers can be used as long as the polymer formed is a polymer which satisfies the general formula (I). Typical synthesis is illustrated in Scheme 1.

Scheme 1
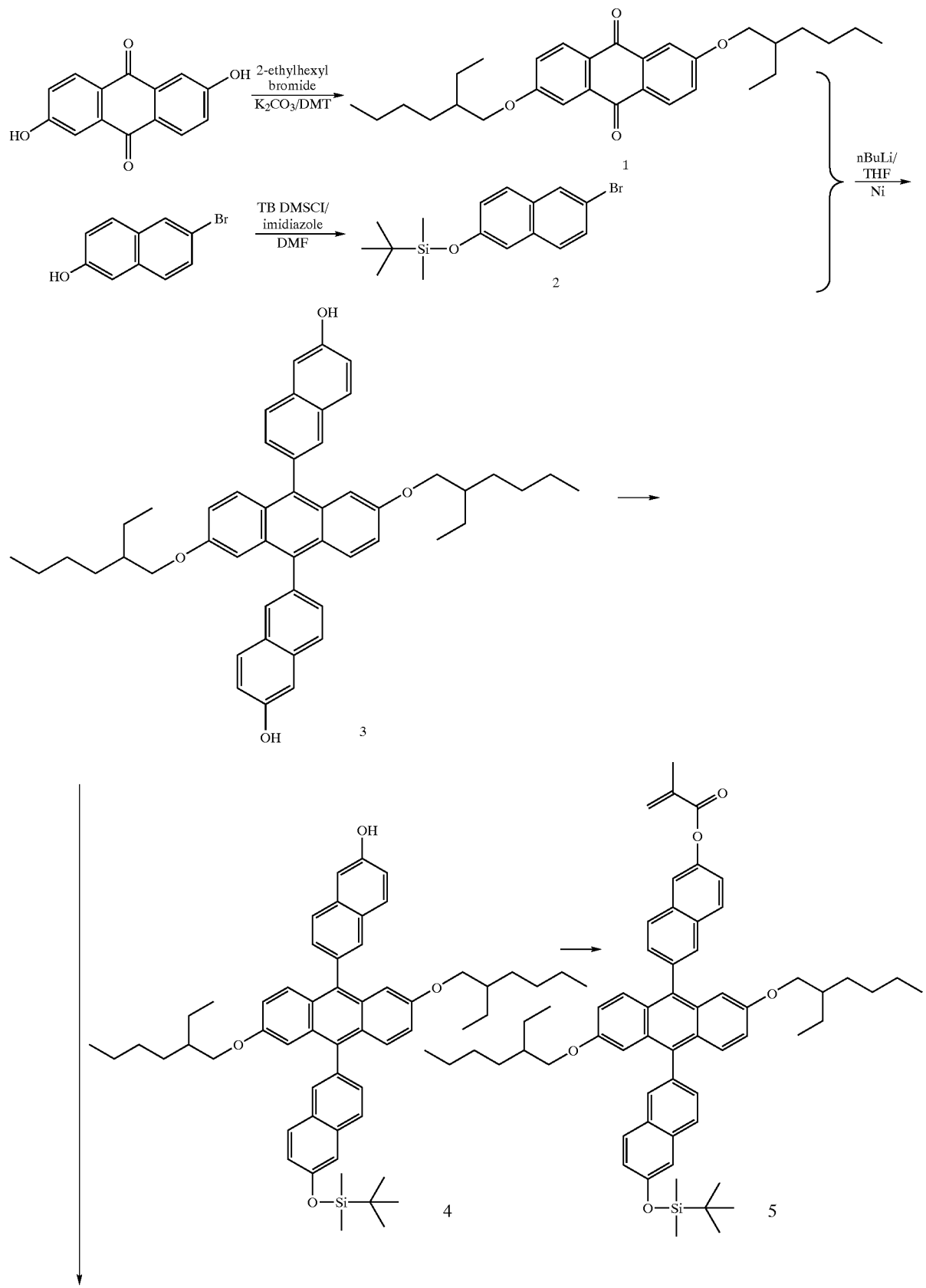

-continued

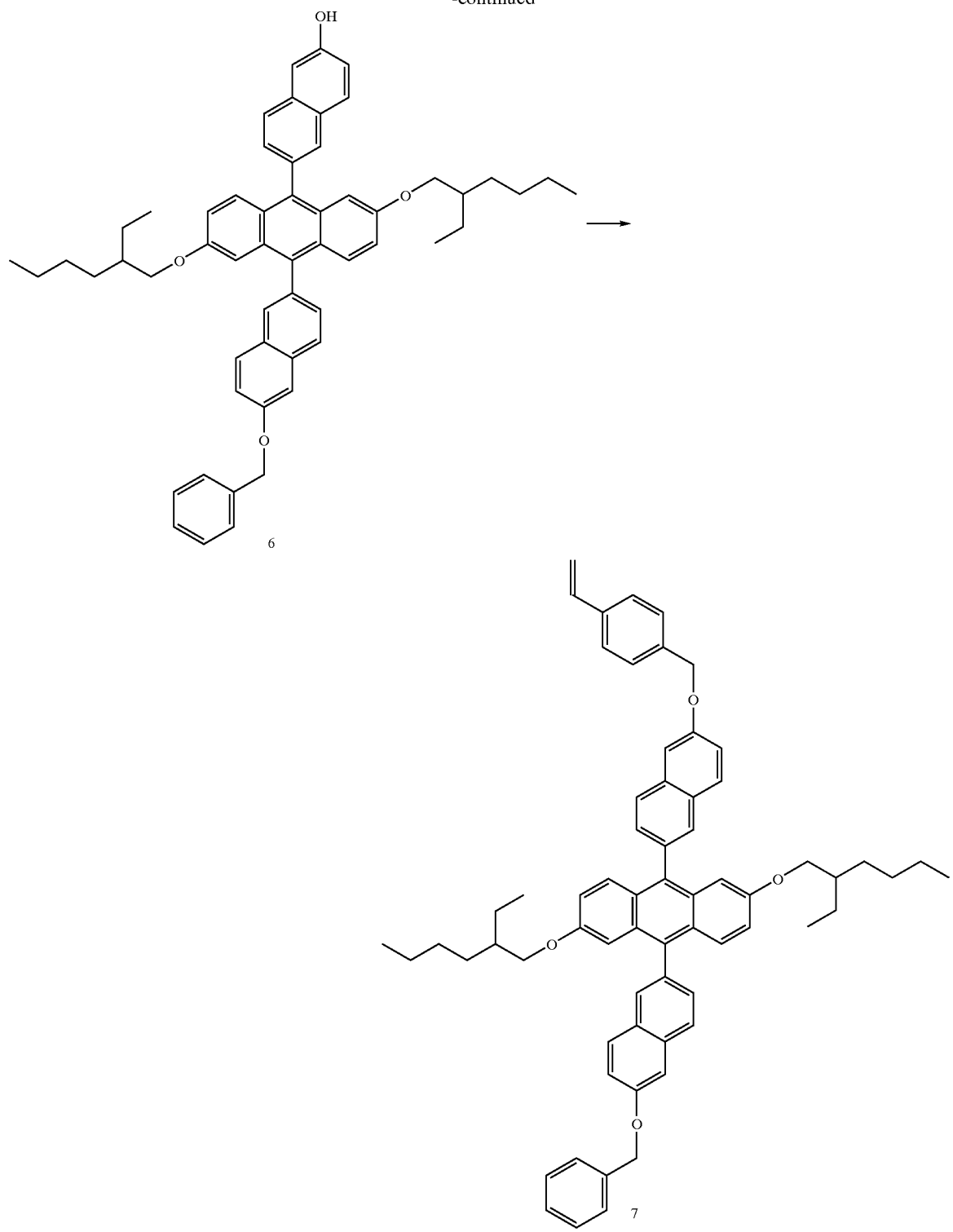

Example 1

Synthesis of 2,6-di(2-ethylhexyloxy)anthraquinone (Compound 1)

2,6-Dihydroxyanthraquinone (100.0 g, 0.42 mol) and 2-ethylhexyl bromide (165.0 g, 0.86 mol) were dissolved in 1 L of DMF. To this solution was added anhydrous K$_2$CO$_3$ (120.0 g, 0.87 mol). The reaction was heated at 90° C. overnight. Most of DMF was removed and 500 mL of water was added. The reaction was extracted with ether (3×400 mL), washed with brine (1×200 mL), and dried over MgSO$_4$. Solvent was removed and the crude product was recrystallized from methanol to give yellow powdery product 125.21 g (65% yield). $^1$H NMR (CDCl$_3$) δ (ppm):

0.92–0.98 (m, 12H, $CH_3$), 1.34–1.54 (m, 16H), 1.75–1.81 (m, 2H,C$\underline{H}$($CH_3$)), 4.02 (d, J=5.5 Hz, 4H, $OCH_2$), 7.19 (d, J=8.4 Hz, 2H), 7.70 (s, 2H), 8.19 (d, J=8.5 Hz, 2H); $^{13}C$ NMR ($CDCl_3$): 11.12, 14.06, 23.04, 23.88, 29.08, 30.51, 39.34, 71.34, 110.64, 120.84, 127.00, 129.62, 135.88, 164.29, 182.27. M.p. 49–51° C.; FD-MS: m/z 464 ($M^+$).

Example 2

Synthesis of 2-bromo-6-t-butyldimethylsiloxynaphthalene (Compound 2)

2-Bromo-6-hydroxynaphthalene (100.0 g, 0.45 mol) and imidazole (75.0 g, 1.10 mol) were dissolved in 300 mL of DMF. To this solution was added TBDMS-Cl (80.0 g, 0.53 mol). The reaction was stirred at room temperature under nitrogen overnight. The reaction was poured into water, and the precipitate was filtered, washed with water and cold ethanol. The crude product was recrystallized from ethanol to give 97.2 g of off-white crystals (64% yield). $^1H$ NMR ($CDCl_3$) δ ppm: 0.24 (s, 6 H), 1.01 (s, 9 H), 7.07 (dd, $J_1$=8.8 Hz, $J_2$=2.3 Hz, 1 H), 7.14 (s, 1 H), 7.45 (dd, $J_1$=8.8 Hz, $J_2$=2.3 Hz, 1 H), 7.53 (d, J=8.8 Hz, 1 H), 7.60 (d, J=8.8 Hz, 1 H), 7.90 (s, 1 H). $^{13}C$ NMR ($CDCl_3$) δ ppm: −4.34, 18.24, 25,68, 114.86, 117.26, 123.05, 128.29, 128.42, 129.39, 129.57, 130.24, 133.04. Mp 62–64° C. FD-MS: 337 ($M^+$).

Example 3

Synthesis of 2,6-bis(2-ethylhexyloxy)-9,10-bis(2-(6-hydroxynaphthyl))anthracene (Compound 3)

Compound 2 (47.0 g, 0.14 mol) was dissolved in 130 mL of anhydrous THF and the solution was cooled to −78° C. To this solution slowly was added nBuLi (2.5 M in hexane, 55.5 mL, 0.14 mol) to maintain the temperature lower than −60° C. After the addition, the reaction was stirred at −78° C. for 1 h. Compound 1 (25.0 g, 0.048 mol) was dissolved in 120 mL of dry THF and added dropwise to the above reaction. After 3 h, TLC indicated the completion of the reaction. The reaction was quenched with HI aqueous solution (47% in water, 85 mL, 1.4 mol) and heated to reflux for 1 h. The reaction was extracted with methylene chloride, and the combined organic phase was washed with saturated sodium meta bisulfite solution and dried over $MgSO_4$. The crude product as a brownish oil/solid was purified by column on silica gel and then recrystallized from $CH_3CN$ to give 25.5 g pure product as light greenish yellow solid (67% yield). $^1H$ NMR ($CDCl_3$) δ (ppm): 0.73–0.84 (m, 12H, $CH_3$), 1.16–1.35 (m, 16H, alkyl), 1.54–1.60 (m, 2H, C$\underline{H}$($CH_2CH_3$)), 3.66 (d, J=5.5 Hz, 4H, $OCH_2$), 6.90 (d, J=2.3 Hz, 2H), 6.98 (dd, $J_1$=9.5 Hz, $J_2$=2.5 Hz, 2H), 7.21 (dd, $J_1$=8.8 Hz, $J_2$=2.4 Hz, 2H), 7.33 (d, J=2.3 Hz, 2H), 7.56 (d, J=9.4 Hz, 2H), 7.84 (d, J=8.8 Hz, 2H), 7.90 (s, 2H), 7.91 (d, J=8.8 Hz, 2H); $^{13}C$ NMR ($CDCl_3$) δ (ppm): 11.07, 14.00, 22.94, 23.78, 28.98, 30.51, 39.00, 70.09, 103.96, 109.54, 118.09, 120.11, 126.55, 127.22, 128.27, 129.08, 129.79, 129.99, 130.08, 130.24, 133.86, 134.71, 134.93, 153.60, 155.69; Mp 174–176° C.; FD-MS: 718 ($M^+$).

Example 4

Synthesis of 2,6-bis(2-ethylhexyloxy)-9-(2-(6-t-butyldimethylsiloxynaphthyl))-10-(2-(6-hydroxynaphthyl))anthracene (Compound 4)

Compound 3 (3.0 g, 4.2 mmol) and imidazole (0.6 g, 8.8 mmol) were dissolved in 15 mL of DMF. To this solution was added TBDMS-Cl (0.99 g, 6.6 mmol). The reaction was stirred at room temperature under nitrogen overnight. The reaction was poured into water, extracted with methylene chloride and the combined organic phase was dried over $MgSO_4$. The crude product was purified by column chromatography on silica gel using hexane/methylene chloride (15/85) as a eluent to give 1.79 g pure product as greenish yellow solid (51% yield). $^1H$ NMR ($CDCl_3$) δ (ppm): 0.33 (s, 6 H), 0.75–0.84 (m, 12 H), 1.08 (s, 9 H), 1.16–1.34 (m, 18 H), 3.66 (d, J=5.3 Hz, 4 H), 6.89–6.91 (m, 2 H), 6.98 (dd, $J_1$=9.5 Hz, $J_2$=2.4 Hz, 2 H), 7.16–7.22 (m, 2 H), 7.34 (dd, J=1=9.5 Hz, $J_2$=2.4 Hz, 2 H), 7.54–7.60 (m, 4 H), 7.797.93 (m, 6 H), $^{13}C$ NMR ($CDCl_3$) δ (ppm): −4.243, 11.07, 14.01, 22.94, 23.78, 25.76, 28.98, 30.52, 39.00, 70.07, 70.13, 103.96, 104.03, 109.50, 114.84, 118.19, 120.09, 122.40, 126.53, 126.82, 127.23, 128.28, 128.33, 128.99, 129.37, 129.52, 129.81, 129.88, 129.99, 130.18, 133.91, 134.61, 134.80, 134.94, 135.04, 153.75, 153.82, 155.68. Mp 125–127° C. FD-MS: 832 ($M^+$).

Example 5

Synthesis of 2,6-bis(2-ethylhexyloxy)-9-(2-(6-t-butyldimethylsiloxynaphthyl))-10-(2-(6-methacryloylnaphthyl))anthracene (Compound 5)

Compound 4 (2.44 g, 2.9 mmol) was dissolved in 30 mL of methylene chloride and triethylamine (0.36 g, 3.5 mmol) was added. The solution was cooled to 0° C. and methacryloyl chloride (0.37 g, 3.5 mmol) was added. The reaction was stirred at room temperature under nitrogen overnight. The reaction was washed with water and the organic phase was dried over $MgSO_4$. The crude product was purified by column chromatography on silica gel using hexane/ethyl acetate (98/2) as an eluent to give 2.01 g pure product as bright yellow solid (76% yield). $^1H$ NMR ($CDCl_3$) δ (ppm): 0.33 (s, 6 H), 0.75–0.85 (m, 12 H), 1.08 (s, 9 H), 1.18–1.38 (m, 18 H), 2.16 (s, 3 H), 3.64–3.67 (m, 4 H), 5.84–5.85 (m, 1 H, vinyl), 6.47 (s, 1 H, vinyl), 6.85 (d, J=1.9 Hz, 1 H), 6.92 (s, 1 H), 6.97–7.01 (m, 2 H), 7.16–7.20 (m, 1 H), 7.35–7.38 (m, 2 H), 7.50–7.64 (m, 4 H), 7.77–7.82 (m, 2 H), 7.89–8.06 (m, 5 H); $^{13}C$ NMR ($CDCl_3$) δ (ppm): −4.25, 11.07, 14.02, 18.32, 18.48, 22.94, 23.82, 25.77, 28.99, 29.03, 30.54, 30.58, 39.00, 39.15, 69.98, 103.58, 104.06, 114.81, 118.67, 120.21, 121.63, 122.41, 126.82, 127.14, 127.18, 127.49, 127.87, 128.06, 128.34, 129.36, 129.52, 129.65, 129.70, 129.80, 129.83, 129.87, 129.96, 130.00, 130.29, 131.67, 133.11, 133.94, 134.46, 134.75, 135.26, 135.92, 137.05, 148.83, 153.79, 155.69, 155.89, 166.21; Mp 213–215° C.; FD-MS: 901 ($M^+$).

Example 6

Synthesis of 2,6-bis(2-ethylhexyloxy)-9-(2-(6-benzyloxynaphthyl))-10-(2-(6-t-butyldimethylsiloxynaphthyl))anthracene (Compound 6)

Compound 3 (7.0 g, 9.7 mmol) was dissolved in 50 mL of acetone and potassium carbonate (2.96 g, 21.4 mmol) and catalytic amount of crown 18-6 were added. To this mixture was added benzyl bromide (1.67 g, 9.7 mmol). The reaction was heated to reflux overnight under nitrogen. Potassium carbonate was filtered off and the filtrate was evaporated. The crude product was purified by column chromatography on silica gel with hexane/methylene chloride as an eluent to give 2.3 g of pure product as greenish yellow solid (29% yield). $^1H$ NMR ($CDCl_3$) δ (ppm): 0.74–1.60 (m, 30 H), 3.66 (d, J=5.4 Hz, 4 H), 5.17 (s, 1 H), 5.27 (s, 2H), 6.90–6.92 (m, 2 H), 6.98 (dd, $J_1$=9.5 Hz, $J_2$=2.2 Hz, 2 H), 7.19 (dd, $J_1$=8.8

Hz, $J_2$=2.4 Hz, 1 H), 7.30–7.58 (m, 12 H), 7.81–7.97 (m, 6 H). $^{13}$C NMR (CDCl$_3$) δ (ppm): 11.09, 14.01, 22.94, 23.78, 29.00, 30.52, 39.02, 70.03, 70.16, 103.90, 107.17, 109.51, 118.08, 119.42, 120.10, 126.53, 126.98, 127.22, 127.60, 128.10, 128.25, 128.68, 129.06, 129.20, 129.70, 129.78, 129.92, 13.00, 130.06, 130.24, 133.77, 133.85, 134.71, 134.82, 136.85, 153.64, 155.70, 157.03. Mp 85–87° C.; S: 808 (M$^+$).

Example 7

Synthesis of 2,6-bis(2-ethylhexyloxy)-9-(2-(6-benzyloxynaphthyl))-10-(4-vinylbenzyloxy)) anthracene (Compound 7)

Compound 6 (1.85 g, 2.3 mmol) was dissolved in 20 mL of acetone and potassium carbonate (0.47 g, 3.43 mmol) and catalytic amount of crown 18-6 were added. To this mixture was added 4-vinyl benzyl chloride (0.52, 3.43 mmol). The reaction was heated to reflux overnight under nitrogen. Potassium carbonate was filtered off and the filtrate was evaporated. The crude product was purified by column chromatography on silica gel with hexane/ethyl acetate (95/5) as an eluent to give 1.7 g of pure product as bright yellow solid (80% yield). $^1$H NMR (CDCl$_3$) δ (ppm): 0.74–0.84 (m, 12 H), 1.17–1.37 (m, 16 H), 1.53–1.60 (m, 2 H), 3.66 (d, J=5.4 Hz, 4 H), 5.26–5.32 (m, 5 H, 4 benzylic H and 1 vinyl H), 5.76–5.85 (m, 1 H), 6.71–6.82 (m, 1 H), 6.91 (d, J=2.1 Hz, 2 H), 6.98 (dd, $J_1$=9.5 Hz, $J_2$=2.3 Hz, 2 H), 7.32–7.58 (m, 17 H), 7.84 (d, J=8.9 Hz, 2 H), 7.90 (s, 2 H), 7.95 (d, J=8.3 Hz, 2 H). $^{13}$C NMR (CDCl$_3$) δ (ppm): 11.11, 14.02, 22.95, 23.80, 29.02, 30.53, 39.04, 70.00, 70.15, 103.87, 107.16, 109.73, 119.40, 120.10, 126.49, 126.97, 127.16, 127.21, 127.59, 127.78, 128.09, 128.24, 128.67, 129.20, 129.69, 129.78, 129.91, 130.08, 133.76, 134.83, 134.94, 136.38, 136.58, 155.71, 157.03. Mp 121–122° C.; MS: 924 (M$^+$).

Example 8

Synthesis of Polymer 17 from Compound 7

Compound 7 (0.70 g) was dissolved in 7 mL of toluene and AIBN (6 mg) was added. The solution was purged with nitrogen for 10 min. and heated to 60° C. overnight. The solution was poured into 60 mL of methanol, and the precipitated polymer was dried filtered, redissoved in toluene and precipitated again from hexane. The resulting bright yellow polymer was dried under vacuum at 45° C. overnight.

Example 9

Synthesis of polymer 22 from Compound 5

Polymer 22 was prepared similarly as polymer 17 as described above.

EL Device Fabrication and Performance

Example 10

An EL device satisfying the requirements of the invention was constructed in the following manner. The organic EL medium has a single layer of the organic compound described in this invention.

a) An indium-tin-oxide (ITO) coated glass substrate was sequentially ultra-sonicated in a commercial detergent, rinsed with deionized water, degreased in toluene vapor and exposed to ultraviolet light and ozone for a few minutes.

b) An aqueous solution of PEDOT (1.3% in water, Baytron P Trial Product AI 4083 from H. C. Stark) was spin-coated onto ITO under a controlled spinning speed to obtain thickness of 500 Angstroms. The coating was baked in an oven at 110° C. for 10 min.

c) A toluene solution of a polymer (300 mg in 30 mL of solvent) was filtered through a 0.2 μm Telfon filter. The solution was then spin-coated onto PEDOT under a controlled spinning speed. The thickness of the film was between 500–1000 Angstroms. On the top of the organic thin film was deposited a cathode layer consisting of 15 angstroms of a CsF salt, followed by a 2000 angstroms of a 10:1 atomic ratio of Mg and Ag. Alternatively, the cathode layer consists of 1500 angstroms of Ca and 500 angstroms of Ag.

The above sequence completed the deposition of the EL device. The device was then hermetically packaged in a dry glove box for protection against ambient environment.

Figure 2:
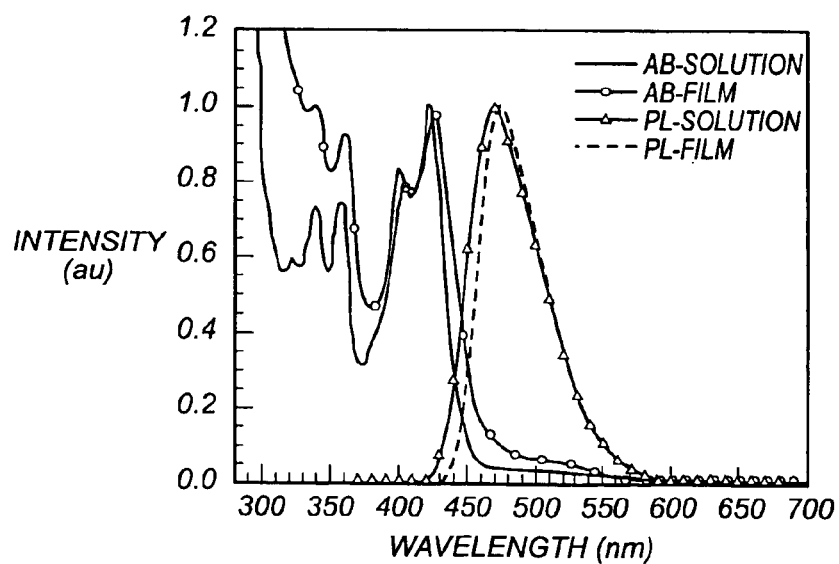
FIG. 2 illustrates the absorption (AB) and photoluminescence (PL) spectra of polymer 22 in a solution and thin film.
Figure 3:
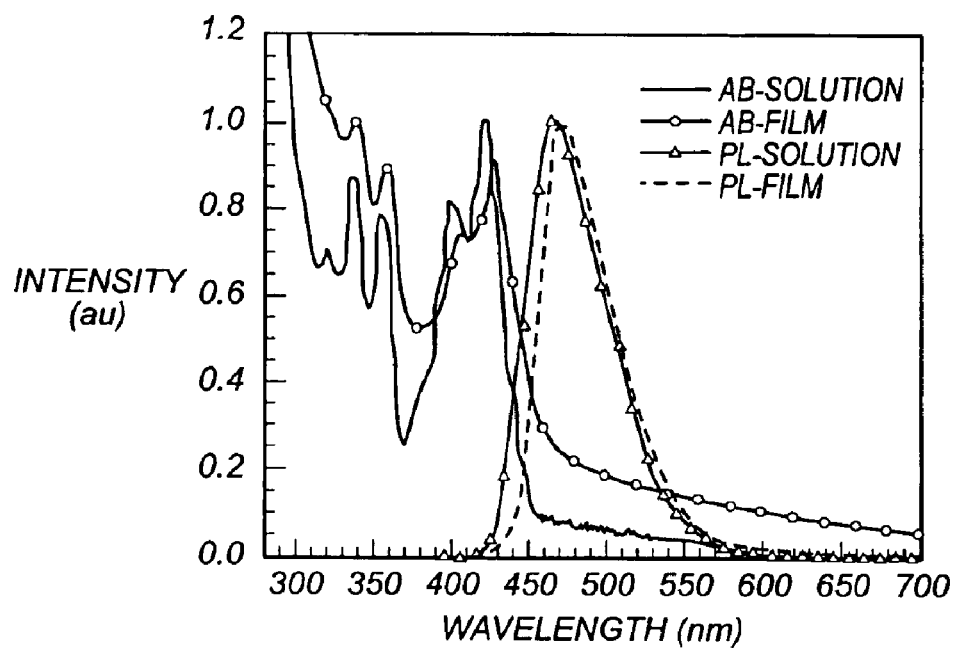
FIG. 3 illustrates the absorption (AB) and photoluminescence (PL) spectra of polymer 17 in solution and thin film.
Figure 4:
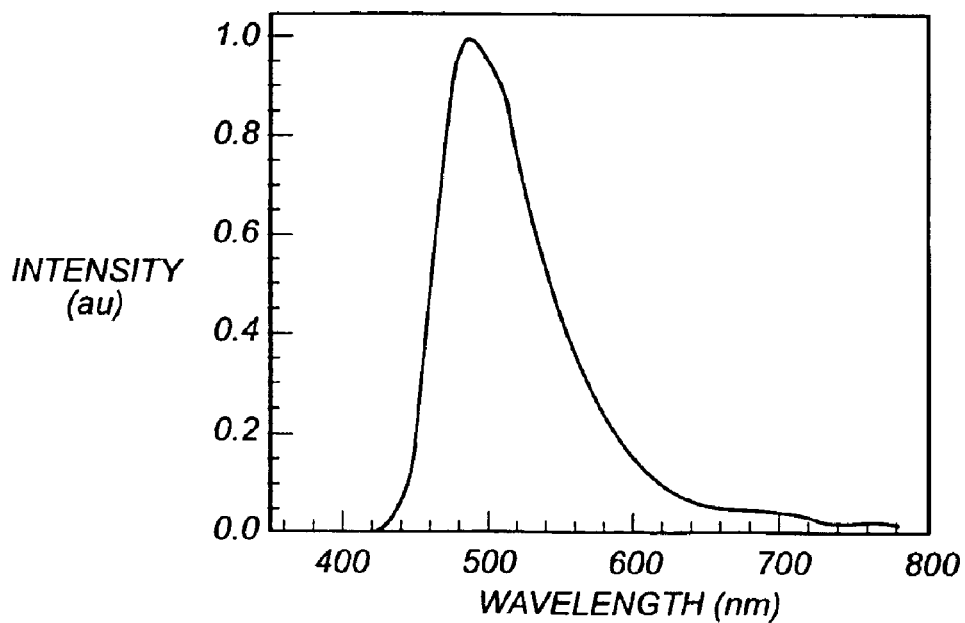
FIG. 4 illustrates the EL spectra of device fabricated from polymer 22: ITO/PEDOT/polymer 22/Ca/Ag.

Table 1 summarizes the characterization of the polymers prepared in the present invention. Absorption (AB) and photoluminescence (PL) spectra were obtained from solid thin films of the polymers and EL spectra were obtained from EL devices: ITO/PEDOT/polymer/CsF/Mg:Ag or ITO/PEDOT/polymer/Ca/Ag. The fabrication of El devices was illustrated in Example 10. FIGS 2 and 3 show the absorption (AB) and photoluminescence (PL) spectra of polymer 22 and 17 in solution and thin film respectively. FIG. 4 shows the EL spectra of device fabricated from polymer 22: ITO/PEDOT/polymer 22/Ca/Ag.

TABLE 1

Characterization of polymers according to Examples.

| Polymer | $M_w$[a] | PDI | $T_d$ (° C.) | $T_g$ (° C.) | AB[b] ($\lambda_{max}$ nm) | PL[c] ($\lambda_{max}$ nm) | EL ($\lambda_{max}$ nm) |
|---|---|---|---|---|---|---|---|
| 17 | 23800 | 1.48 | 334 | 105 | 338 | 474(340) | 504 |
| 22 | 48200 | 4.77 | 386 | 113 | 426 | 474(340) | 484 |

[a]weight average molecular weight, determined by size exclusion chromatography in THF using polystyrene standard.
[b]as solid state thin film
[c]as solid state thin film, the nwnber in the parenthesis is the excitation wavelength.

The entire contents of the patents and other publications referred to in this specification are incorporated herein by reference.

The invention has been described in detail with particular reference to certain preferred embodiments thereof, but it will be understood that variations and modifications can be effected within the spirit and scope of the invention.

PARTS LIST

101 Substrate
103 Anode
105 Hole-Injecting layer (HIL)
107 Hole-Transporting layer (HTL)
109 Light-Emitting layer (LEL)
111 Electron-Transporting layer (ETL)
113 Cathode
250 Current/Voltage source
260 Electrical conductors

What is claimed is:

1. An electroluminescent device comprising an anode, a spaced-apart cathode, and polymeric luminescent materials disposed between the spaced-apart anode and cathode, the polymeric luminescent materials includes pendant 9,10-dinaphthylanthracene-based polymers having a repeating unit of the formula

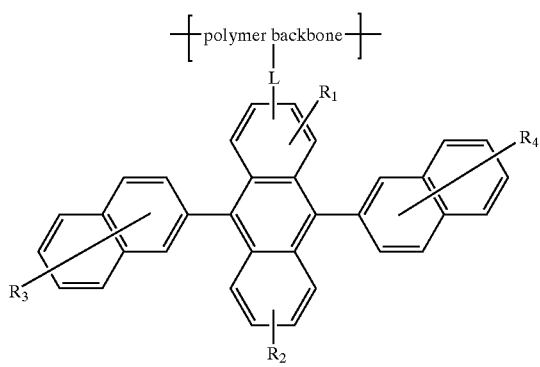

wherein
- R₁, R₂, R₃, and R₄ are the same or different, and are each individually hydrogen, or alkyl, or alkenyl, or alkynyl, or alkoxy, or amino wherein alkyl, alkenyl, alkynyl, alkoxy or amino can have from 1 to 40 carbon atoms; or aryl of from 6 to 60 carbon atoms; or heteroaryl of from 4 to 60 carbons; or F, or Cl, or Br; or a cyano group; or a nitro group; and
- L is a direct bond between 9,10-dinaphthylanthracene and polymer backbone or a carbon linking group having 1 to 40 carbon atoms or a non-carbon linking group having 0 to 40 carbon atoms.

2. The electroluminescent device of claim 1 wherein the polymer backbone includes a vinyl polymer backbone, polyacetyl, polyether, polyurethane, polyimide, polyamide, polyurea, polyester, polyketone, polycarbonate, polysiloxane, polyarene, poly(arylene vinylene), or poly(arylene acetylene).

3. The electroluminescent device of claim 1 wherein the polymer backbone is a vinyl polymer backbone.

4. A method of making an electromuminescent device, comprising:

a) providing an anode and a spaced-apart cathode; and b) depositing a luminescent polymer between the anode and spaced-apart cathode and including a polymer having pendant 9,10-dinaphthylanthracene-based structure represented by repeating unit of the formula

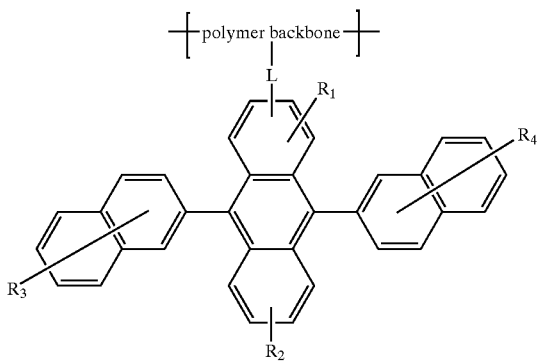

wherein:
- R₁, R₂, R₃, and R₄ are the same or different, and are each individually hydrogen, or alkyl, or alkenyl, or alkynyl, or alkoxy, or amino wherein the alkyl, alkenyl, alkynyl, alkoxy or amino can have from 1 to 40 carbon atoms; or aryl of from 6 to 60 carbon atoms; or heteroaryl of from 4 to 60 carbons; or F, or Cl, or Br; or a cyano group; or a nitro group; and
- L is a direct bond between 9,10-dinaphthylanthracene and polymer backbone or a carbon linking group having 1 to 40 carbon atoms or a non-carbon linking group having 0 to 40 carbon atoms.

* * * * *